(12) United States Patent
Haukka et al.

(10) Patent No.: US 9,816,180 B2
(45) Date of Patent: Nov. 14, 2017

(54) SELECTIVE DEPOSITION

(71) Applicant: ASM IP HOLDING B.V., Almere (NL)

(72) Inventors: Suvi P. Haukka, Helsinki (FI); Eva Tois, Espoo (FI)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 15/013,637

(22) Filed: Feb. 2, 2016

(65) Prior Publication Data

US 2016/0222504 A1  Aug. 4, 2016

Related U.S. Application Data

(60) Provisional application No. 62/111,508, filed on Feb. 3, 2015.

(51) Int. Cl.
*H01L 21/302* (2006.01)
*C23C 16/04* (2006.01)
(Continued)

(52) U.S. Cl.
CPC .......... *C23C 16/04* (2013.01); *C23C 16/0227* (2013.01); *C23C 16/0272* (2013.01);
(Continued)

(58) Field of Classification Search
CPC ... C23C 16/40; C23C 16/402; C23C 16/0227; C23C 16/0272; C23C 16/04;
(Continued)

(56) References Cited

U.S. PATENT DOCUMENTS 5,633,036 A * 5/1997 Seebauer ................ C23C 16/04
204/192.25
6,482,740 B2 11/2002 Soininen et al.
(Continued)

FOREIGN PATENT DOCUMENTS

EP 0469456 A1 2/1992
EP 0880168 A2 11/1998
(Continued)

OTHER PUBLICATIONS

Burton, B.B. et al., "Atomic Layer Deposition of MgO Using Bis(ethylcyclopentadienyl)magnesium and H2O". J. Phys. Chem. C, 2009, 113, 1939-1946.
(Continued)

*Primary Examiner* — Lan Vinh
(74) *Attorney, Agent, or Firm* — Knobbe, Martens, Olson & Bear LLP

(57) ABSTRACT

Methods are provided for selectively depositing a surface of a substrate relative to a second, different surface. An exemplary deposition method can include selectively depositing a material, such as a material comprising nickel, nickel nitride, cobalt, iron, and/or titanium oxide on a first surface, such as a $SiO_2$ surface, relative to a second, different surface, such as a H-terminated surface, of the same substrate. Methods can include treating a surface of the substrate to provide H-terminations prior to deposition.

25 Claims, 7 Drawing Sheets

(51) Int. Cl.
*C23C 16/40* (2006.01)
*C23C 16/02* (2006.01)
*C23C 16/06* (2006.01)
*C23C 16/455* (2006.01)

(52) U.S. Cl.
CPC ............ *C23C 16/06* (2013.01); *C23C 16/402* (2013.01); *C23C 16/45525* (2013.01)

(58) Field of Classification Search
CPC . C23C 16/06; H01L 21/306; H01L 21/30604; H01L 21/26
USPC ........ 427/569, 567, 568; 438/745, 750, 754, 438/798
See application file for complete search history.

(56) References Cited

U.S. PATENT DOCUMENTS

| | | | |
|---|---|---|---|
| 6,679,951 B2 | 1/2004 | Soininen et al. | |
| 6,878,628 B2 | 4/2005 | Sophie et al. | |
| 6,887,795 B2 | 5/2005 | Soininen et al. | |
| 6,921,712 B2 | 7/2005 | Soininen et al. | |
| 7,067,407 B2 | 6/2006 | Kostamo et al. | |
| 7,084,060 B1 | 8/2006 | Furukawa et al. | |
| 7,220,669 B2 | 5/2007 | Hujanen et al. | |
| 7,241,677 B2 | 7/2007 | Soininen et al. | |
| 7,405,143 B2 | 7/2008 | Leinikka et al. | |
| 7,494,927 B2 | 2/2009 | Kostamo et al. | |
| 7,927,942 B2 | 4/2011 | Raaijmakers | |
| 7,955,979 B2 | 6/2011 | Kostamo et al. | |
| 8,293,597 B2 | 10/2012 | Raaijmakers | |
| 8,536,058 B2 | 9/2013 | Kostamo et al. | |
| 8,890,264 B2 | 11/2014 | Dewey et al. | |
| 8,993,404 B2 | 3/2015 | Korbrinsky et al. | |
| 9,067,958 B2 | 6/2015 | Romero | |
| 9,112,003 B2 | 8/2015 | Haukka et al. | |
| 9,129,897 B2 | 9/2015 | Pore et al. | |
| 9,236,292 B2 | 1/2016 | Romero et al. | |
| 9,257,303 B2 | 2/2016 | Haukka et al. | |
| 9,490,145 B2 | 11/2016 | Niskanen et al. | |
| 9,502,289 B2 | 11/2016 | Haukka et al. | |
| 2002/0090777 A1 | 7/2002 | Forbes et al. | |
| 2003/0027431 A1* | 2/2003 | Sneh ....................... | C23C 16/02 438/758 |
| 2003/0066487 A1 | 4/2003 | Suzuki | |
| 2004/0219746 A1 | 11/2004 | Vaartstra et al. | |
| 2006/0019493 A1 | 1/2006 | Li | |
| 2006/0047132 A1 | 3/2006 | Shenai-Khatkhate et al. | |
| 2006/0141155 A1 | 6/2006 | Gordon et al. | |
| 2006/0199399 A1* | 9/2006 | Muscat ............... | C23C 16/0272 438/798 |
| 2007/0241390 A1 | 10/2007 | Tanaka et al. | |
| 2008/0179741 A1 | 7/2008 | Streck et al. | |
| 2009/0071505 A1 | 3/2009 | Miya et al. | |
| 2010/0248473 A1 | 9/2010 | Ishizaka et al. | |
| 2011/0221061 A1 | 9/2011 | Prakash et al. | |
| 2012/0088369 A1* | 4/2012 | Weidman ............... | G03F 7/0752 438/703 |
| 2013/0005133 A1 | 1/2013 | Lee et al. | |
| 2013/0095664 A1 | 4/2013 | Matero et al. | |
| 2013/0115768 A1 | 5/2013 | Pore et al. | |
| 2013/0189837 A1 | 7/2013 | Haukka et al. | |
| 2013/0280919 A1 | 10/2013 | Yuasa et al. | |
| 2014/0001572 A1 | 1/2014 | Bohr et al. | |
| 2014/0091308 A1 | 4/2014 | Dasgupta et al. | |
| 2014/0120738 A1 | 5/2014 | Jung et al. | |
| 2014/0152383 A1 | 6/2014 | Nikonov et al. | |
| 2014/0190409 A1* | 7/2014 | Matsumoto ............. | C23C 16/40 118/715 |
| 2015/0093890 A1 | 4/2015 | Blackwell et al. | |
| 2015/0097292 A1 | 4/2015 | He et al. | |
| 2015/0118863 A1* | 4/2015 | Rathod ............. | H01L 21/02164 438/778 |
| 2015/0162214 A1 | 6/2015 | Thompson et al. | |
| 2015/0179798 A1 | 6/2015 | Clendenning et al. | |
| 2015/0217330 A1 | 8/2015 | Haukka et al. | |
| 2015/0299848 A1 | 10/2015 | Haukka et al. | |
| 2017/0037513 A1 | 2/2017 | Haukka et al. | |
| 2017/0040164 A1 | 2/2017 | Wang et al. | |
| 2017/0058401 A1 | 3/2017 | Blackwell et al. | |

FOREIGN PATENT DOCUMENTS

| | | |
|---|---|---|
| EP | 1340269 | 2/2009 |
| JP | 4333900 | 9/2009 |
| KR | 10-0869326 | 11/2008 |
| KR | 10-2012-0120902 | 11/2012 |
| TW | 175767 | 8/2003 |
| WO | WO 02/45167 | 6/2002 |
| WO | WO 2011/156705 | 12/2011 |
| WO | WO 2014209390 A1 | 12/2014 |
| WO | WO 2015/047345 | 4/2015 |
| WO | WO 2015094305 A1 | 6/2015 |
| WO | WO 2015147843 A1 | 10/2015 |
| WO | WO 2015147858 A1 | 10/2015 |

OTHER PUBLICATIONS

Burton, B.B., et al. "SiO2 Atomic Layer Deposition Using Tris(dimethylamino)silane and Hydrogen Peroxide Studied by in Situ Transmission FTIR Spectroscopy". J. Phys. Chem. C, 2009, 113, 8249-8257.

Chen et al., Highly Stable Monolayer Resists for Atomic Layer Deposition on Germanium and Silicon, Chem. Matter, vol. 18, No. 16, pp. 3733-3741, 2006.

Ghosal et al., Controlling Atomic Layer Deposition of TiO2 in Aerogels through Surface Functionalization, Chem. Matter, vol. 21, pp. 1989-1992, 2009.

King, Dielectric Barrier, Etch Stop, and Metal Capping Materials for State of the Art and beyond Metal Interconnects, ECS Journal of Solid State Science and Technology, vol. 4, Issue 1, pp. N3029-N3047, 2015.

Lee et al., Area-Selective Atomic Layor Deposition Using Self-Assembled Monolayer and Scanning Probe Lithography, Journal of the Electrochemical Society, vol. 156, Issue 9, pp. G125-G128, 2009.

Liang, Xuehai, et al., "Growth of Ge Nanofilms Using Electrochemical Atomic Layer Deposition, with a "Bait and Switch" Surface-Limited Reaction". Journal of American Chemical Society, 2011, 133, 8199-8024.

Low et al., Selective deposition of CVD iron on silicon dioxide and tungsten, Microelectronic Engineering 83, pp. 2229-2233, 2006.

Mackus et al., Influence of Oxygen Exposure on the Nucleation of Platinum Atomic Layer Deposition: Consequences for Film Growth, Nanopatterning, and Nanoparticle Synthesis, Chem. Matter, vol. 25, pp. 1905-1911, 2013.

Mackus et al., Local deposition of high-purity Pt nanostructures by combining electron beam induced deposition and atomic layer deposition, Journal of Applied Physics, vol. 107, pp. 116102-1-116102-3, 2010.

Overhage et al., Selective Atomic Layer Deposition (SALD) of Titanium Dioxide on Silicon and Copper Patterned Substrates, Journal of Undergraduate Research 4, Mar. 29, 2011 in 4 pages.

Parulekar et al., Atomic Layer Deposition of Zirconium Oxide on Copper Patterned Silicon Substrate, Journal of Undergraduate Research, vol. 7, pp. 15-17, 2014.

Parulekar et al., Selective atomic layer deposition of zirconium oxide on copper patterned silicon substrate, pp. 1-6, 2013.

Schmeißer, Decomposition of formic acid, Chemnitz University of Technology, pp. 1-13, Aug. 31, 2011.

Schmeißer, Reduction of Copper Oxide by Formic Acid an ab-initio study, Chemnitz University of Technology, pp. 1-42, Sep. 2011.

Selvaraj et al., Selective atomic layer deposition of zirconia on copper patterned silicon substrates using ethanol as oxygen source

(56) References Cited

OTHER PUBLICATIONS as well as copper reductant, Journal of Vacuum Science & Technology A, vol. 32, No. 1, pp. 010601-1-010601-4, Jan. 2014.

* cited by examiner

SELECTIVE DEPOSITION

CROSS-REFERENCE TO RELATED APPLICATIONS

The present application claims the benefit of U.S. Provisional Application No. 62/111,508, filed Feb. 3, 2015, entitled "SELECTIVE DEPOSITION" the disclosure of which is incorporated herein by reference in its entirety.

BACKGROUND OF THE INVENTION

Field of the Invention

The present application relates to selective deposition on a first surface of a substrate relative to a second surface. In addition, further processing can be used to subsequently deposit a different material on the second surface relative to the first.

Description of the Related Art

Selective deposition processes are needed in the semiconductor industry for making smaller and smaller structures.

Integrated circuits are currently manufactured by an elaborate process in which various layers of materials are sequentially constructed in a predetermined arrangement on a semiconductor substrate.

The predetermined arrangement of materials on a semiconductor substrate is often accomplished by deposition of a material over the entire substrate surface, followed by removal of the material from predetermined areas of the substrate, such as by deposition of a mask layer and subsequent selective etching process.

In certain cases, the number of steps involved in manufacturing an integrated surface on a substrate could be reduced by utilizing a selective deposition process, wherein a material is selectively deposited on a first surface relative to a second surface. It is well known that it is very difficult to achieve selective deposition by vapor deposition processes such as atomic layer deposition (ALD). Typically, long carbon chain self-assembled monolayers (SAMs) are used to guide film growth on selected surfaces.

SUMMARY OF THE INVENTION

In some aspects, deposition methods are provided. In some embodiments a substrate may be provided comprising a first surface and a second, different surface. In some embodiments the first surface comprises at least one $AH_x$ termination, where A is one or more of N, O, or S and x is from 1 to 2, and the second surface is a H-terminated surface. In some embodiments the substrate may be contacted with a first vapor phase precursor comprising Ni, Ti, Fe, or Co to thereby selectively deposit a material comprising Ni, Ti, Fe, or Co on the first surface of the substrate relative to the second surface of the same substrate. In some embodiments the selectively deposited material may comprise Ni or Co. In some embodiments the deposition method may further comprise contacting the substrate with a second vapor phase reactant. In some embodiments the second H-terminated surface may be formed by treating at least a portion of the substrate surface prior to depositing the thin film. In some embodiments the second H-terminated surface may be formed by treating at least a portion of the substrate surface with a HF etch. In some embodiments the second H-terminated surface may be formed by treating at least a portion of the substrate surface with a silicon compound comprising $ClSiH_3$ or $(R^IR^{II}N)SiH_3$, where $R^I$ and $R^{II}$ are independently selected from $C_1$-$C_4$ alkyls, such as methyl, ethyl, n-propyl, i-propyl, n-butyl, i-butyl. In some embodiments the first surface may comprise at least one OH-termination. In some embodiments the first surface may comprise $SiO_2$. In some embodiments the first surface may be a low-k insulator. In some embodiments the first surface may comprise silicon oxide, silicon nitride, silicon oxynitride, fluorinated silica glass, carbon doped silicon oxide, or another material comprising at least 50% silicon oxide. In some embodiments the second surface may comprise —$SiH_3$, —$SiH_2$, or —SiH surface terminations. In some embodiments the material comprising Ni, Ti, Fe, or Co may be selectively deposited on the first surface relative to the second H-terminated surface with a selectivity of at least 90%. In some embodiments the deposition method may be an ALD or CVD process.

In some aspects methods of selectively depositing a material comprising Ni, Ti, Fe, or Co on a substrate are provided. In some embodiments a substrate comprising a first surface comprising silicon oxide may be provided. In some embodiments at least a portion of the first surface may be etched to thereby provide a second H-terminated surface. In some embodiments a material comprising Ni, Ti, Fe, or Co may be selectively deposited on the first silicon oxide surface relative to the second H-terminated surface. In some embodiments selectively depositing a material comprising Ni, Ti, Fe, or Co comprises selectively depositing until a material comprising Ni, Ti, Fe, or Co of a desired thickness is formed. In some embodiments the method of selectively depositing a material comprising Ni, Ti, Fe, or Co may be an ALD or CVD process. In some embodiments etching at least a portion of the first surface may comprise exposing said portion of the first surface to HF. In some embodiments the material comprising Ni, Ti, Fe, or Co film may be selectively deposited on the first surface relative to the second H-terminated surface with a selectivity of at least 90%.

In some aspects methods for selectively forming $SiO_2$ on a substrate are provided. In some embodiments the methods may comprise selectively depositing a material comprising Ni, Ti, Fe, or Co on a first surface of the substrate relative to a second, different, H-terminated surface of the same substrate, wherein the first surface comprises at least an $AH_x$ termination, where A is one or more of O, N and S and x is from 1 to 2. $SiO_2$ may be selectively deposited on the second H-terminated surface of the substrate relative to the first surface of the same substrate. In some embodiments a method may comprise etching the substrate to remove the material comprising Ni, Ti, Fe, or Co from the substrate. In some embodiments etching the substrate may comprise exposing the substrate to at least one of HCl, $HNO_3$, or $H_2SO_4$:$H_2O_2$. In some embodiments the first surface may comprise an OH-terminated surface. In some embodiments the first surface may comprise silicon oxide. In some embodiments the second surface may comprise —SiH, —$SiH_2$, or —$SiH_3$ surface terminations. In some embodiments $SiO_2$ may be selectively deposited on the second surface of the substrate relative to the first surface by a PEALD or thermal ALD process.

BRIEF DESCRIPTION OF THE DRAWINGS

The invention will be better understood from the Detailed Description and from the appended drawings, which are meant to illustrate and not to limit the invention, and wherein.

DETAILED DESCRIPTION

Figure 1:
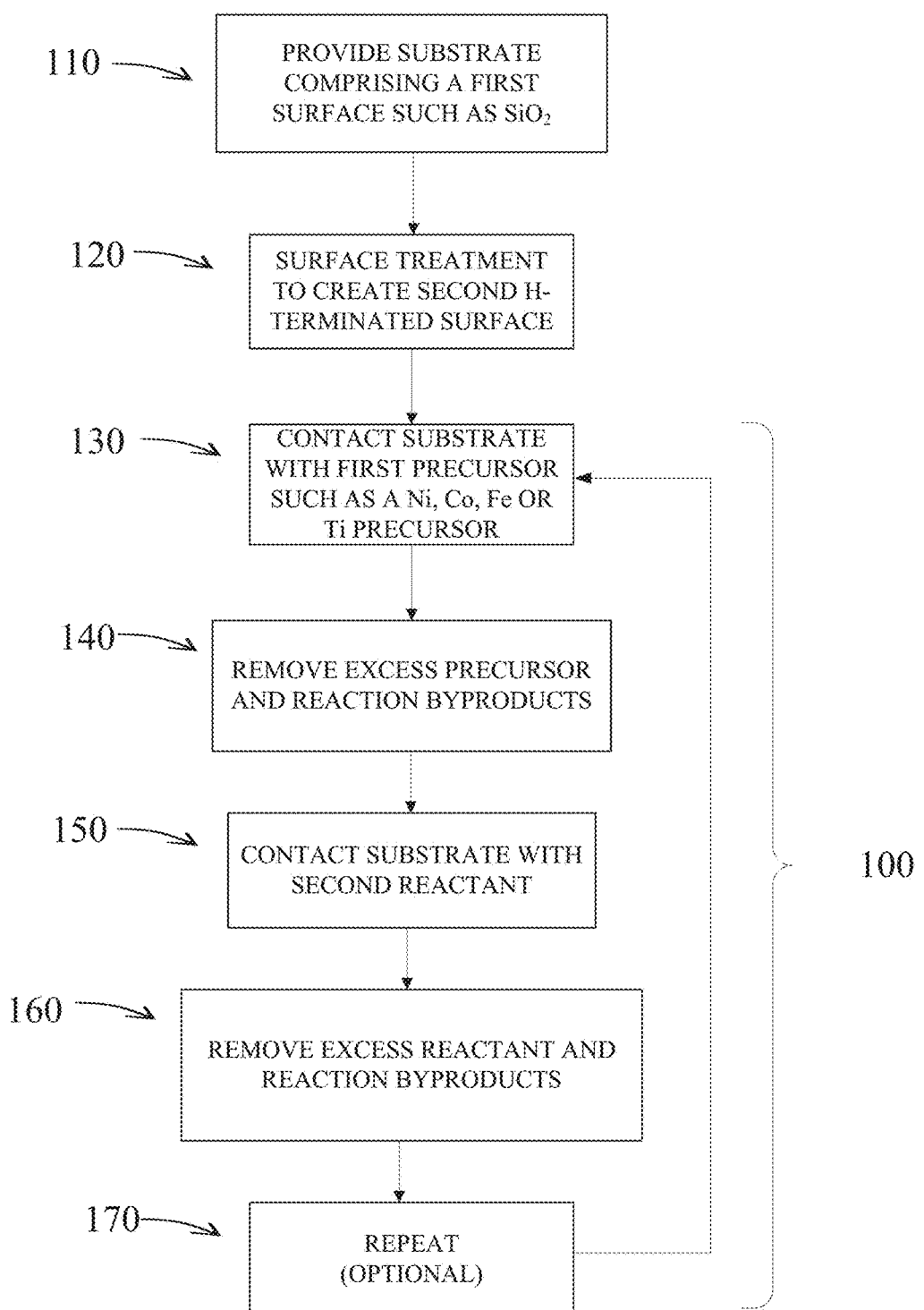
FIG. 1 illustrates a deposition process flow for selectively depositing a material such as Ni metal, nickel nitride ($NiN_x$), cobalt, iron or titanium oxide on a first surface of a substrate relative to a second, different surface of the same substrate.

In some situations it is desirable to selectively deposit a material on one surface of a substrate relative to a second, different surface of the same substrate. For example, selective deposition may be used to form capping layers, barrier layers, etch stop layers, sacrificial and/or protective layers or for sealing pores, such as in porous low k materials.

Using the processes described herein, in some embodiments a material comprising Ni, Ti, Fe, or Co, such as Ni metal, nickel nitride or $NiN_x$, cobalt, iron or titanium oxide structures can selectively be grown on $SiO_2$ based surfaces, and other surfaces as described herein. As used herein, nickel nitride or $NiN_x$ refers to a material comprising at least some Ni—N bonds.

In some embodiments, a first material, such as a material comprising Ni, Ti, Fe, or Co, such as nickel, nickel nitride or $NiN_x$, cobalt, iron or titanium oxide film, may be deposited selectively on a first surface relative to a second, different surface. For example, a nickel, nickel nitride, cobalt, iron or titanium oxide film can be selectively deposited on a low-k insulator surface, for example an oxide or nitride surface, such as a form of silicon oxide or silicon nitride, relative to a second surface, such as a H-terminated surface of the same substrate.

In some embodiments the first surface on which selective deposition occurs comprises an $AH_x$-termination, where A is one or more of N, O or S and x is from 1 to 2. In some embodiments the first surface comprises OH-terminations. In some embodiments the first surface is an $NH_x$-terminated surface such as a —NH or —$NH_2$ terminated surface. In some embodiments the first surface is an $SH_x$-terminated surface.

In some embodiments the first surface is a dielectric surface, such as a $SiO_2$ surface or silicon oxynitride surface. In some embodiments the first surface may comprise silicon oxides, silicon nitrides, silicon oxynitrides, fluorinated silica glass (FSG), carbon doped silicon oxide (SiOC) and/or materials containing more than about 50% silicon oxide. In some embodiments the first surface comprises OH-groups and may comprise, for example, an alumina ($Al_2O_3$) surface with —OH surface groups.

In some embodiments the second surface is a —$SiH_3$, —$SiH_2$, or —SiH surface. In some embodiments the second surface is formed by etching native oxide of silicon and the second surface comprises Si—H bonds. In some embodiments the second surface is a pure silicon surface.

In some embodiments one or more surfaces may be treated to enhance or decrease deposition on the treated surface relative to a second, different surface. In some embodiments a first surface may be treated, or activated, in order to enhance deposition on the first surface relative to one or more different surfaces. In some embodiments a portion of a first surface may be treated, or deactivated, in order to decrease deposition on the treated portion of the first surface relative to the untreated first surface in some embodiments a second surface may be treated, or deactivated, in order to decrease deposition on the second surface relative to the first surface of the substrate. In some embodiments a first surface is treated to enhance deposition and a second surface is treated to decrease deposition, thereby increasing selective deposition on the first surface relative to the second surface.

In some embodiments a material comprising Ni, Ti, Fe, or Co, such as a nickel, nickel nitride ($NiN_x$), Co, Fe or titanium oxide layer is deposited on a first surface as discussed above, for example a low-k insulator surface, such as an oxide surface, relative to a second H-terminated surface of the substrate, such as a second surface comprising —$SiH_3$, —$SiH_2$, or —SiH. In some embodiments the first surface is a $SiO_2$ surface of a substrate. The second surface may be treated prior to or at the beginning of the material comprising Ni, Ti, Fe, or Co, such as nickel, nickel nitride ($NiN_x$), Co, Fe or titanium oxide deposition process in order to decrease deposition on the second surface relative to the first surface by forming H-terminations on the second surface. That is, selective deposition on the first surface (e.g. $SiO_2$) may be increased relative to the treated, or deactivated, second surface.

In some embodiments a first substrate surface comprising a dielectric material, such as $SiO_2$, another oxide, or another material as described herein, is treated to deactivate, or decrease deposition of the material comprising Ni, Ti, Fe, or Co, on one or more portions of the substrate. For example, one or more portions of the first substrate surface may be treated to form a second H-terminated surface, such as a —$SiH_3$, —$SiH_2$, or —SiH terminated surface. In some embodiments the one or more portions of the first surface are treated with HF to form a second H-terminated surface in those areas.

In some embodiments a portion of the first surface as described herein, such as a portion of a $SiO_2$ surface or other oxide surface is deactivated by reacting that portion of the surface with a silicon compound to form a second surface comprising —$SiH_3$, —$SiH_2$, or —SiH groups. Such silicon compounds may comprise, for example, $ClSiH_3$ or $(R'R''N)SiH_3$.

Following treatment to form a second H-terminated surface, a material comprising Ni, Ti, Fe, or Co may be selectively deposited on the remaining first surface, such as a first oxide (e.g. $SiO_2$) surface, relative to the H-terminated second surface.

In some embodiments a deactivating treatment does not involve formation of a self-assembled monolayer (SAM). In some embodiments a deactivating treatment does not comprise treatment with an organic agent.

In some embodiments a portion of an H-terminated surface (e.g., a —$SiH_3$, —$SiH_2$, or —SiH terminated surface) may be treated to facilitate selective deposition of a material comprising Ni, Ti, Fe, or Co, such as nickel, nickel nitride ($NiN_x$), Co, Fe or titanium oxide film on the treated portion of the surface relative to an untreated surface. For example, a portion of a H-terminated surface, such as an etched Si surface ($SiH_x$) may be treated to provide a hydrophilic OH-terminations on the treated portion of the surface. The OH-terminated surface can be reactive with nickel, Co, Fe or titanium precursors, as described herein. Thus, in some embodiments OH-terminations (or other terminations as described herein) can be provided to enhance deposition of the material comprising Ni, Ti, Fe, or Co on an OH-terminated portion of the surface relative to a second, remaining H-terminated surface.

The first surface on which material is selectively deposited, such as a $SiO_2$, other oxide, or other material, surface as described herein, may comprise hydroxyl, or OH-groups, which may have the effect of making the surface hydrophilic. Such OH-group surface terminations can occur naturally when the surface is exposed to ambient conditions, for example an atmosphere comprising water. In some embodiments at least a portion of a substrate surface may be treated to provide a first hydrophilic OH-terminated surface. In some embodiments at least a portion of a hydrophilic OH-terminated surface may be treated to increase the amount of OH-groups on the surface. For example, the surface may be exposed to $H_2O$ vapor in order to increase the number of OH-groups at the surface. In some embodiments at least a portion of a silicon substrate surface is exposed to air and/or moisture, for example an atmosphere comprising water, in order to provide a first hydrophilic surface that comprises at least some OH-groups. In some embodiments a hydrophilic surface is not treated prior to deposition.

In some embodiments at least a portion of an OH-terminated surface (or other first surface as described herein) can be treated to inhibit deposition of a material comprising Ni, Ti, Fe, or Co, such as nickel, nickel nitride ($NiN_x$), Co, Fe or titanium oxide thereon. For example, at least a portion of a first OH-terminated surface may be contacted with HF to provide H-terminations and thereby provide a second H-terminated surface. In some embodiments a $SiO_2$ surface is etched with HF, for example 0.5% HF, to provide a $SiH_x$ surface at the etched portion of the $SiO_2$ surface. As mentioned above, a portion of a first OH-surface can also be treated by reacting the first surface with a silicon compound to form Si—H groups on that portion of the first surface. Such silicon compounds may comprise, for example, $ClSiH_3$ or $(R^IR^{II}N)SiH_3$, wherein $R^I$ and $R^{II}$ can be independently selected $C_1$-$C_5$ alkyl groups. The conversion of an OH-terminated surface (or other first surface as described herein) to a H-terminated surface can inhibit deposition of a material comprising Ni, Ti, Fe, or Co, such as nickel, nickel nitride, Co, Fe or titanium oxide on the treated portion of the surface relative to a first surface, such as a $SiO_2$ surface of the substrate (or other first surface as described herein).

In some embodiments a semiconductor substrate is provided that comprises a dielectric such as $SiO_2$. A portion of the surface may be selectively etched by exposure to HF, for example 0.5% HF, thereby creating a first surface comprising $SiO_2$ and a second surface comprising hydrogen-terminated silicon, such as a —$SiH_3$, —$SiH_2$, or —Si—H surface at the etched portion of the first $SiO_2$ surface. A material comprising Ni, Ti, Fe, or Co, such as nickel, nickel nitride ($NiN_x$), Co, Fe or titanium oxide film may then be selectively deposited on the first surface comprising $SiO_2$ relative to the second H-terminated surface.

In some embodiments a semiconductor substrate is provided that comprises a dielectric such as $SiO_2$. A portion of the surface may be selectively exposed to a silicon compound, for example, $ClSiH_3$, $(R^IR^{II}N)_2SiH_2$, $X_ySiH_{4-y}$, $(R^IR^{II}N)SiH_{4-y}$, $(R^IR^{II}N)SiH_3$, or another silicon precursor as described herein, to form Si—H surface groups, such as $SiH_x$ groups, on that portion of the surface, thereby creating a first surface comprising $SiO_2$ and a second surface comprising hydrogen-terminated silicon, such as a —$SiH_x$ surface. A material comprising Ni, Ti, Fe, or Co, such as nickel, nickel nitride ($NiN_x$), Co, Fe or titanium oxide film may then be selectively deposited on the first surface comprising $SiO_2$ relative to the second H-terminated surface.

In some embodiments the deposition process is a chemical vapor deposition (CVD) type process. In some embodiments the deposition process is an atomic layer deposition (ALD) type process. In some embodiments the deposition process is a pure ALD process in which each surface reaction is self-limiting. In some embodiments the deposition process is a vapor deposition process comprising one or more deposition cycles in which a substrate is alternately and sequentially contacted with a first vapor phase reactant and a second vapor phase reactant.

In some embodiments a material comprising Ni, such as a Ni layer is selectively deposited on a first surface of a substrate as described above, such as a first $SiO_2$ surface of a substrate, relative to a second H-terminated surface, such as a —$SiH_x$ surface on the same substrate.

In some embodiments a material comprising Co, such as a Co layer is selectively deposited on a first surface of a substrate as described above, such as a first $SiO_2$ surface of a substrate, relative to a second H-terminated surface, such as a —$SiH_3$, —$SiH_2$, or —SiH surface on the same substrate.

In some embodiments a material comprising Fe, such as a Fe layer is selectively deposited on a first surface of a substrate as described above, such as a first $SiO_2$ surface of a substrate, relative to a second H-terminated surface, such as a —$SiH_3$, —$SiH_2$, or —SiH surface on the same substrate.

In some embodiments a material comprising Ni, such as a nickel nitride ($NiN_x$) layer is selectively deposited on a first surface of a substrate as described above, such as a first $SiO_2$ surface of a substrate, relative to a second H-terminated surface, such as a surface comprising —$SiH_3$, —$SiH_2$, or —SiH on the same substrate.

In some embodiments a material comprising Ti, such as a titanium oxide layer is selectively deposited on a first surface of a substrate as described above, such as a first $SiO_2$ surface of a substrate, relative to a second H-terminated surface, such as a surface comprising —$SiH_3$, —$SiH_2$, or —SiH on the same substrate.

In some embodiments deposition on a first surface of a substrate as described herein, such as a $SiO_2$ surface of the substrate, relative to a second H-terminated surface of the substrate is at least about 90% selective, at least about 95% selective, at least about 96%, 97%, 98% or 99% or greater selective. In some embodiments deposition only occurs on the first surface and does not occur on the second surface. In some embodiments deposition on the first surface of the substrate relative to the second surface of the substrate is at least about 70% selective, or at least about 80% selective, which may be selective enough for some particular applications. In some embodiments deposition on the first surface of the substrate relative to the second surface of the substrate is at least about 50% selective, which may be selective enough for some particular applications.

In some embodiments an etch step may be used subsequent to or in the course of deposition to remove material that is non-selectively deposited. Although the addition of an etch step would typically add cost and complexity to the process, in some situations it may be commercially desirable, for example if it is less expensive overall than other options. In some embodiments an etch process may be a wet etch process or a dry etch process. In some embodiments a dry etch is preferable.

In some embodiments deposition on a first surface of a substrate as described herein, such as a first $SiO_2$ surface of a substrate, relative to a second H-terminated surface of the substrate can be performed up to about 500 deposition cycles before losing the selectivity, or up to about 50 deposition cycles, or up to about 20 deposition cycles, or up to about 10 deposition cycles, or up to about 5 deposition cycles before losing selectivity. In some embodiments even deposition of 1 or 2 cycles before losing selectivity can be useful.

Depending on the specific circumstances, a loss of selectivity may be considered to have occurred when deposition on the first surface of the substrate relative to the second surface of the substrate is less than about 50%, less than about 60%, less than about 70%, less than about 80%, less than about 90% selective, less than about 95% selective, less than about 96%, 97%, 98% or 99% selective or greater.

In some embodiments deposition on the first surface, such as a first $SiO_2$ surface of the substrate relative to the second H-terminated surface of the substrate can be performed up to a thickness of about 50 nm before losing the selectivity, or up to about 10 nm, or up to about 5 nm, or up to about 3 nm, or up to about 2 nm, or up to about 1 nm before losing selectivity. In some embodiments even deposition of up to 3 Å or 5 Å before losing selectivity can be useful. Depending on the specific circumstances, a loss of selectivity may be considered to have occurred when deposition on the first surface of the substrate relative to the second surface of the substrate is less than about 50% selective, less than about 60% selective, less than about 70%, less than about 80%, less than about 90% selective, less than about 95% selective, less than about 96%, 97%, 98% or 99% selective or greater.

CVD Type Processes

In some embodiments CVD can be used to selectively deposit a materials comprising Ni, Ti, Fe, or Co, such as nickel, nickel nitride ($NiN_x$), Co, Fe or titanium oxide on a first substrate surface as described above, such as a first —OH surface, for example a $SiO_2$ surface, relative to a second H-terminated surface, such as a surface comprising —$SiH_3$, —$SiH_2$, or —SiH as described herein. In some embodiments a material comprising Ni, Ti, Fe, or Co, such as nickel, nickel nitride, Co or Fe is selectively deposited by a pulsed CVD process in which multiple pulses of a nickel, nickel nitride, Co or Fe precursor or reactants are separated by purge or removal steps in which reactant is removed from the substrate surface.

CVD type processes typically involve gas phase reactions between two or more reactants. The reactants can be provided simultaneously to the reaction space or substrate. The substrate or reaction space can be heated to promote the reaction between the gaseous reactants. CVD deposition occurs when the reactants are provided to the reaction space or substrate. In some embodiments the reactants are provided until a thin film having a desired thickness is deposited. As mentioned above, in some embodiments cyclical CVD type processes can be used with multiple cycles used to deposit a thin film having a desired thickness. In some embodiments one or more plasma reactants can be used in the CVD process.

In some embodiments an ALD-process can be modified to be a partial CVD processes. In some embodiments a partial CVD process can include at least partial decomposition of one or more precursors. In some embodiments ALD processes can be modified to be a pulsed CVD processes. In some embodiments an ALD process is modified to use overlapping or partially overlapping pulses of reactants. In some embodiments an ALD process is modified to use extremely short purge or removal times, such as below 0.1 s (depending on the reactor). In some embodiments an ALD process is modified to use extremely long or continuous pulse times. For example, in some embodiments an ALD process is modified to use no purge or removal at all after at least one pulse. In some embodiments no purge is used after a metal reactant pulse. In some embodiments no purge is used after an oxygen reactant pulse. In some embodiments no purge is used after either a metal reactant pulse or an oxygen reactant pulse.

In some embodiments a single metal precursor is utilized. Thus, in some embodiments the process may not include contacting the substrate with a vapor phase second reactant. In some embodiments a substrate is exposed to one precursor pulse, or sequential precursor pulses separate by a precursor removal or purge step. For example, in some embodiments a substrate may be continuously or intermittently contacted with a vapor phase metal precursor and not with a vapor phase second reactant. Although in some embodiments a substrate may be contact by another species that does not react, such as an inert purge gas or carrier gas, in addition to the vapor phase metal precursor. In some embodiments a deposition process may include only one metal precursor pulse. In some embodiments the substrate may be contacted with a vapor phase metal precursor, excess metal precursor and reaction byproducts, if any, may be removed from the substrate surface, and the substrate may again be contacted with a vapor phase metal precursor, for example in a sequential pulse. In some embodiments the substrate may not contacted with a second reactant. Although in some embodiments a substrate may be contacted by another species that does not react, such as an inert purge gas or carrier gas, in addition to the vapor phase metal precursor.

ALD Type Processes

ALD type processes are based on controlled, self-limiting surface reactions of precursor chemicals. Gas phase reactions are avoided by alternately and sequentially contacting the substrate with the reactants or precursors. Vapor phase reactants are separated from each other on the substrate surface, for example, by removing excess reactants and/or reactant byproducts from the reaction chamber or substrate surface between reactant pulses or by moving the substrate from one reactant to another.

Briefly, a substrate comprising a first surface and second, different surface is heated to a suitable deposition temperature, generally at lowered pressure. Deposition temperatures are generally maintained below the thermal decomposition temperature of the reactants but at a high enough level to avoid condensation of reactants and to provide the activation energy for the desired surface reactions. Of course, the appropriate temperature window for any given ALD reaction will depend upon the surface termination and reactant species involved.

Here, the temperature is preferably at or below about 500° C., more preferably at or below about 400° C. and most preferably from about 100° C. to about 350° C. In some cases, for example in cases in which nickel betadiketiminato compounds are used for deposition, a temperature from about 275° C. to about 325° C. may be selected.

The surface of the substrate may be contacted with a vapor phase first reactant. Conditions are preferably selected such that no more than about one monolayer of the first reactant is adsorbed on the substrate surface in a self-limiting manner. The appropriate contacting times can be readily determined by the skilled artisan based on the particular circumstances.

In some embodiments excess first reactant and reaction byproducts, if any, are removed from the substrate surface, such as by purging with an inert gas. Purging means that vapor phase precursors and/or vapor phase byproducts are removed from the substrate surface such as by evacuating a chamber with a vacuum pump and/or by replacing the gas inside a reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, such as where highly conformal step coverage over extremely high aspect ratio structures or other structures with complex surface morphology is needed. In some embodiments the substrate is removed from a reaction space comprising the first reactant.

The surface of the substrate is contacted with a vapor phase second gaseous reactant. Excess second reactant and gaseous byproducts of the surface reaction, if any, are removed from the substrate surface. In some embodiments this may be accomplished by purging. In some embodiments the substrate is removed from the reaction space comprising the second reactant.

The steps of contacting and removing are repeated until a thin film of the desired thickness has been selectively formed on the first surface of substrate, with each cycle leaving no more than a molecular monolayer. Additional phases comprising alternately and sequentially contacting the surface of a substrate with additional, different reactants can be included to form more complicated materials, such as ternary materials.

An excess of reactants or precursors is typically supplied in each phase to saturate the susceptible structure surfaces. Surface saturation ensures reactant occupation of all available reactive sites (subject, for example, to physical size or "steric hindrance" restraints) and thus ensures excellent step coverage. Typically, less than one molecular layer of material is deposited with each cycle, however, in some embodiments more than one molecular layer is deposited during the cycle.

Removing excess reactants or precursors can include evacuating some of the contents of a reaction space and/or purging a reaction space with helium, nitrogen or another inert gas. In some embodiments purging can comprise turning off the flow of the reactive gas while continuing to flow an inert carrier gas to the reaction space.

The precursors employed in the ALD type processes may be solid, liquid or gaseous materials under standard conditions (room temperature and atmospheric pressure), provided that the precursors are in vapor phase before they are contacted with the substrate surface. Contacting a substrate surface with a vaporized precursor means that the precursor vapor is in contact with the substrate surface for a limited period of time. Typically, the contacting time is from about 0.05 to 10 seconds. However, depending on the substrate type and its surface area, the contacting time may be even higher than 10 seconds. Contacting times can be on the order of minutes in some cases. The optimum contacting time can be determined by the skilled artisan based on the particular circumstances.

The mass flow rate of the precursors can also be determined by the skilled artisan. In some embodiments the flow rate of metal precursors is preferably between about 1 and 1000 sccm without limitation, more preferably between about 100 and 500 sccm.

The pressure in a reaction chamber is typically from about 0.01 to about 20 mbar, more preferably from about 1 to about 10 mbar. However, in some cases the pressure will be higher or lower than this range, as can be determined by the skilled artisan given the particular circumstances.

Before starting the deposition of the film, the substrate is typically heated to a suitable growth temperature. The growth temperature varies depending on the type of thin film formed, physical properties of the precursors, etc. The growth temperatures are discussed in greater detail herein in reference to each type of thin film formed. The growth temperature can be less than the crystallization temperature for the deposited materials such that an amorphous thin film is formed or it can be above the crystallization temperature such that a crystalline thin film is formed. The preferred deposition temperature may vary depending on a number of factors such as, and without limitation, the reactant precursors, the pressure, flow rate, the arrangement of the reactor, crystallization temperature of the deposited thin film, and the composition of the substrate including the nature of the material to be deposited on. The specific growth temperature may be selected by the skilled artisan.

Examples of suitable reactors that may be used include commercially available equipment such as the F-120® reactor, F-450® reactor, Pulsar® reactors—such as the Pulsar® 2000 and the Pulsar® 3000-EmerALD® reactor and Advance® 400 Series reactors, available from ASM America, Inc. of Phoenix, Ariz. and ASM Europe B. V., Almere, Netherlands. Other commercially available reactors include those from ASM Japan K. K (Tokyo, Japan) under the tradename Eagle® XP and XP8.

In some embodiments a batch reactor may be used. Suitable batch reactors include, but are not limited to, reactors commercially available from and ASM Europe B. V (Almere, Netherlands) under the trade names ALDA400™ and A412™. In some embodiments a vertical batch reactor is utilized in which the boat rotates during processing, such as the A412™. Thus, in some embodiments the wafers rotate during processing. In some embodiments in which a batch reactor is used, wafer-to-wafer uniformity is less than 3% (1 sigma), less than 2%, less than 1% or even less than 0.5%.

The growth processes can optionally be carried out in a reactor or reaction space connected to a cluster tool. In a cluster tool, because each reaction space is dedicated to one type of process, the temperature of the reaction space in each module can be kept constant, which improves the throughput compared to a reactor in which is the substrate is heated up to the process temperature before each run.

A stand-alone reactor can be equipped with a load-lock. In that case, it is not necessary to cool down the reaction space between each run.

Referring to FIG. 1 and according to some embodiments a substrate comprising a first surface as described above, such as $SiO_2$, is provided at step 110. A portion of the oxide surface is selectively treated to form a surface comprising H-terminations 120. For example, the portion of the surface may be selectively etched such as with HF to form a H-terminated surface comprising —$SiH_3$, —$SiH_2$, or —SiH.

A materials comprising Ni, Ti, Fe, or Co, such as nickel, nickel nitride ($NiN_x$), Co, Fe or titanium oxide is selectively deposited on the first $SiO_2$ surface of the substrate relative to the second H-terminated surface by an ALD type deposition process 100 comprising multiple cycles, each cycle comprising:

contacting the surface of a substrate with a vaporized first precursor at step 130. The first precursor may comprise a nickel precursor, Co precursor, Fe precursor or a titanium precursor;

removing excess first precursor and reaction by products, if any, from the surface at step 140;

contacting the surface of the substrate with a second vaporized reactant at step 150;

removing from the surface, at step 160, excess second reactant and any gaseous by-products formed in the reaction between the first precursor layer on the first surface of the substrate and the second reactant, and;

optionally repeating at step 170 the contacting and removing steps until a thin film comprising the selectively deposited material of the desired thickness has been formed.

As mentioned above, in some embodiments one or more surfaces of the substrate may be treated in order to enhance deposition on one surface relative to one or more different surfaces prior to beginning the deposition process 100. In FIG. 1 this is indicated by step 120.

Although the illustrated deposition cycle begins with contacting the surface of the substrate with the first precursor, in other embodiments the deposition cycle begins with contacting the surface of the substrate with the second reactant. It will be understood by the skilled artisan that in general contacting the substrate surface with the first precursor and second reactant are interchangeable in the ALD cycle.

In some embodiments, the reactants and reaction by-products can be removed from the substrate surface by stopping the flow of first precursor while continuing the flow of an inert carrier gas such as nitrogen or argon.

In some embodiments, the reactants and reaction by-products can be removed from the substrate surface by stopping the flow of second reactant while continuing the flow of an inert carrier gas. In some embodiments the substrate is moved such that different reactants alternately and sequentially contact the surface of the substrate in a desired sequence for a desired time. In some embodiments the removing steps, 140 and 160 are not performed. In some embodiments no reactant may be removed from the various parts of a chamber. In some embodiments the substrate is moved from a part of the chamber containing a first precursor to another part of the chamber containing the second reactant. In some embodiments the substrate is moved from a first reaction chamber to a second, different reaction chamber.

In some embodiments each reaction is self-limiting and monolayer by monolayer growth is achieved. These may be referred to as "true ALD" reactions. In some such embodiments the nickel precursor (or other precursor as described herein) may adsorb on the substrate surface in a self-limiting manner. A second reactant in turn will react with the adsorbed nickel precursor to form up to a monolayer of nickel (or other material as described herein) on the substrate.

However, in some embodiments ALD-type reactions are provided, in which there may be some precursor decomposition, but the growth saturates. That is, in some embodiments although a certain amount of film growth may be caused by thermal decomposition of the nickel precursor (or other metal precursor as described herein) at some deposition temperatures, saturated growth is preferably achieved when the second reactant is utilized. Such a reaction is an example of an ALD-type reaction. In such ALD-type reactions, films with good uniformity and relatively few impurities can be deposited.

In some embodiments thermal decomposition of one or more precursors occurs, in particular the nickel, Co, Fe or Ti precursor. In such cases, the growth rate may not fully plateau with increasing pulse times. Rather, the growth rate may continue to rise with increased pulse times, although the growth rate may increase more slowly with ever increasing pulse times. Thus in some embodiments a pulsed-CVD type deposition process is used, in which reactants are provided alternately and separately, but some gas-phase reactions may occur. Preferably the conditions are selected such that surface controlled decomposition is the mechanism for decomposition, which leads to good uniformity and good step coverage. Reaction conditions can also be selected such that good control of the reactions is maintained, leading to good quality films with low impurities.

Thus, in some embodiments the deposition temperature is below the thermal decomposition temperature of the nickel precursor (or other precursor as described herein) while in other embodiments the deposition temperature may be at or above the thermal decomposition temperature.

As mentioned above, in some embodiments a thin film is selectively deposited on a first surface, such as a $SiO_2$ surface relative to a second H-terminated surface, such as a —$SiH_3$, —$SiH_2$, or —SiH terminated surface, by a pulsed CVD process in which a vapor phase metal precursor is intermittently pulsed into a reaction space comprising the substrate and purged from the reaction space. In some embodiments a single metal precursor is utilized. In some embodiments a substrate is exposed to one precursor pulse, or sequential precursor pulses separated by a precursor removal or purge step. Thus, in some embodiments the process may not include contacting the substrate with a vapor phase second reactant. For example, in some embodiments a substrate may be continuously or intermittently contacted with a vapor phase metal precursor and not with a vapor phase second reactant. Although in some embodiments a substrate may be contact by another species that does not react, such as an inert purge gas or carrier gas, in addition to the vapor phase metal precursor. In some embodiments a deposition process may include only one metal precursor pulse. In some embodiments the substrate may be contacted with a vapor phase metal precursor, excess metal precursor and reaction byproducts, if any, may be removed from the substrate surface, and the substrate may again be contacted with a vapor phase metal precursor, for example in a sequential pulse. In some embodiments the substrate may not contacted with a second reactant. Although in some embodiments a substrate may be contacted by another species that does not react, such as an inert purge gas or carrier gas, in addition to the vapor phase metal precursor.

Selective Deposition of Ni on $SiO_2$

As mentioned above, in some embodiments a material comprising nickel is selectively deposited on a first substrate surface (as described above, such as a $SiO_2$ surface of a substrate) relative to a second, H-terminated surface of the same substrate, such as an —$SiH_3$, —$SiH_2$, or —SiH surface.

In some embodiments the second, H-terminated surface is formed prior to deposition by treating a surface to provide H-terminations and thereby inhibit nickel deposition on the second surface relative to the first surface. In some embodiments the treatment may be an in situ treatment. In some embodiments the second surface may be an $SiO_2$ surface that is treated to provide a H-terminated surface, for example an —SiH$_3$, —SiH$_2$, or —SiH terminated surface. In some embodiments the second surface may be contacted with a chemical that provides an H-termination, such as by forming a —SiH$_3$, —SiH$_2$, or —SiH surface. In some embodiments treatment of a SiO$_2$ surface may comprise etching that surface with HF, such as 0.5% HF. A mask or other processes may be used to treat one or more portions of the first surface to create the second H-terminated surface. For example, a mask or other process may be used to selectively etch one or more portions of a SiO$_2$ substrate in order to form a second SiH$_x$ surface while remaining portions of the first SiO$_2$ surface are not disturbed.

In some embodiments the first surface can be treated to enhance Ni deposition thereon. For example, a first SiO$_2$ surface can be treated to increase the amount of OH-groups on the surface.

In some embodiments nickel deposition on a first surface relative to a second surface, such as a first SiO$_2$ surface of the substrate relative to a second SiH$_x$ surface of the substrate, is at least about 90% selective, at least about 95% selective, at least about 96%, 97%, 98% or 99% or greater selective. In some embodiments deposition only occurs on the first surface and does not occur on the second surface. In some embodiments deposition on the first surface of the substrate relative to the second surface of the substrate is at least about 50% selective, at least about 70% selective, or at least about 80% selective, which may be selective enough for some particular applications.

Figure 2:
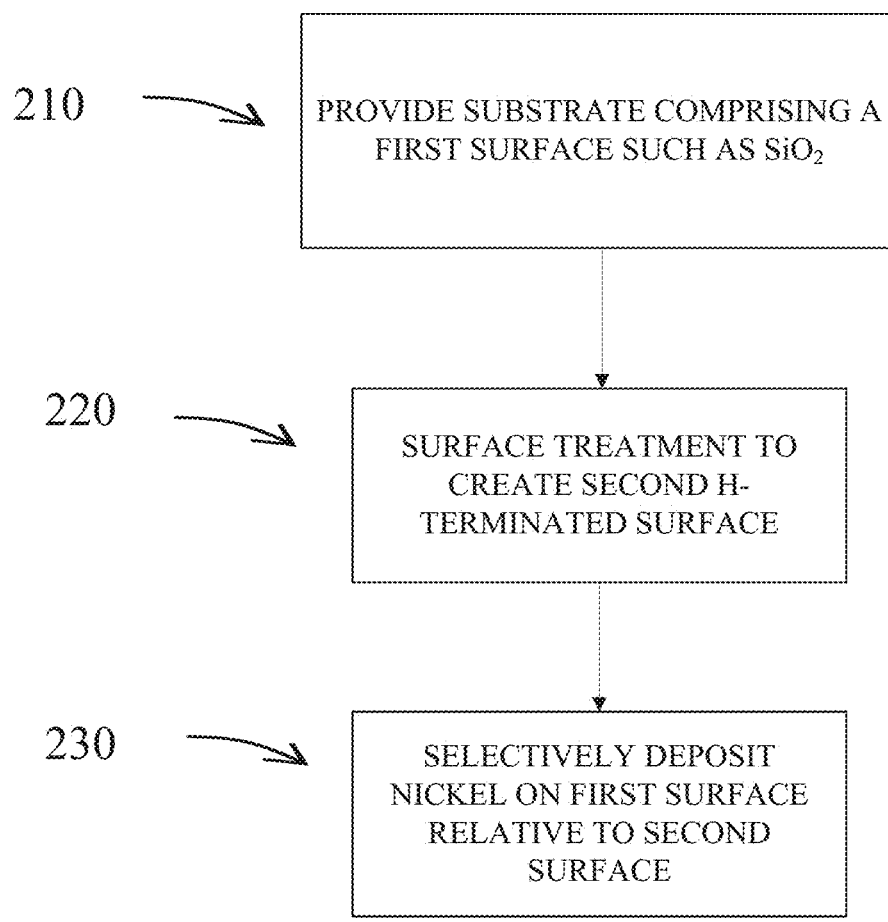
FIG. 2 illustrates a deposition process flow for selectively depositing nickel on a first surface of a substrate relative to a second, different surface of the same substrate.

Referring to FIG. 2 and according to some embodiments a substrate comprising a first surface as described above, such as a SiO$_2$ surface is provided at step 210. A portion of the SiO$_2$ surface is selectively treated by exposure to HF to form a H-terminated second surface, such as a —SiH$_3$, —SiH$_2$, or —SiH surface 220.

A material comprising nickel is selectively deposited 230 on the SiO$_2$ surface of the substrate relative to the H-terminated surface by a vapor deposition process, such as by ALD or CVD.

In some embodiments an elemental Ni thin film is selectively formed on a first SiO$_2$ surface of a substrate in a reaction chamber relative to a second H-terminated surface, such as a —SiH$_3$, —SiH$_2$, or —SiH surface, by an ALD type process comprising multiple Ni deposition cycles, each deposition cycle comprising:

contacting the substrate surface with a first vapor phase reactant comprising a first Ni precursor to form a layer of the Ni precursor on the substrate;

removing excess first reactant from the substrate surface;

contacting the substrate with a second vapor phase reactant such that the second reactant reacts with the first Ni precursor on the substrate in a self-limiting manner to form Ni; and removing excess second reactant and reaction byproducts, if any, from the substrate surface.

This can be referred to as the Ni deposition cycle. Each Ni deposition cycle typically forms at most about one monolayer of Ni selectively on the SiO$_2$ surface. In some cases where the deposition temperature is above the decomposition temperature of the Ni precursor, more than one monolayer of Ni can be formed in each Ni deposition cycle. The Ni deposition cycle can be repeated until a film of a desired thickness is formed.

Although the illustrated Ni deposition cycle begins with provision of the first Ni precursor, in other embodiments the deposition cycle begins with the provision of the second reactant. It will be understood by the skilled artisan that provision of the first Ni precursor and second reactant are interchangeable in the ALD cycle.

In some embodiments, the reactants and reaction by-products can be removed from the substrate surface by stopping the flow of reactant while continuing the flow of an inert carrier gas such as nitrogen or argon. In some embodiments the reactants and reaction by-products can be removed from the substrate surface by removing the substrate from the reaction chamber, or moving the substrate within the reaction chamber.

As mentioned above, in some embodiments a nickel thin film is selectively deposited on a first surface, such as a SiO$_2$ surface relative to a second H-terminated surface, such as a —SiH$_3$, —SiH$_2$, or —SiH terminated surface, by a pulsed CVD process in which a vapor phase nickel precursor is alternately pulsed into a reaction space comprising the substrate and purged from the reaction space.

In some embodiments a single nickel precursor is utilized. Thus, in some embodiments the process may not include contacting the substrate with a vapor phase second reactant. In some embodiments a substrate is exposed to one precursor pulse, or sequential precursor pulses separate by a precursor removal or purge step. For example, in some embodiments a substrate may be continuously or intermittently contacted with a vapor phase nickel precursor and not with a vapor phase second reactant. Although in some embodiments a substrate may be contact by another species that does not react, such as an inert purge gas or carrier gas, in addition to the vapor phase nickel precursor. In some embodiments a deposition process may include only one nickel precursor pulse. In some embodiments the substrate may be contacted with a vapor phase nickel precursor, excess nickel precursor and reaction byproducts, if any, may be removed from the substrate surface, and the substrate may again be contacted with a vapor phase nickel precursor, for example in a sequential pulse. In some embodiments the substrate may not contacted with a second reactant. Although in some embodiments a substrate may be contacted by another species that does not react, such as an inert purge gas or carrier gas, in addition to the vapor phase nickel precursor.

Selective Deposition of NiN$_x$ on SiO$_2$

As mentioned above, in some embodiments a material comprising Ni, such as a material comprising nickel nitride (NiN$_x$) is selectively deposited on a first substrate surface as described above, such as a first SiO$_2$ surface of a substrate, relative to a second, H-terminated surface of the same substrate, such as an —SiH$_3$, —SiH$_2$, or —SiH surface.

In some embodiments the second, H-terminated surface is formed prior to deposition by treating a surface to provide H-terminations and thereby inhibit deposition of a material comprising Ni, such as a nickel nitride on the second surface relative to the first surface. In some embodiments the treatment may be an in situ treatment. In some embodiments the second surface may be an SiO$_2$ surface that is treated to provide a H-terminated surface, for example an —SiH$_3$, —SiH$_2$, or —SiH terminated surface. In some embodiments the second surface may be contacted with a chemical that provides an H-termination, such as by forming a —SiH$_3$, —SiH$_2$, or —SiH surface. In some embodiments treatment of a SiO$_2$ surface may comprise etching that surface with HF, such as 0.5% HF. A mask or other processes may be used to treat one or more portions of the first surface to create the second H-terminated surface. For example, a mask or other process may be used to selectively etch one or more portions of a $SiO_2$ substrate in order to form a second $SiH_x$ surface while remaining portions of the first $SiO_2$ surface are not disturbed.

In some embodiments the first surface can be treated to enhance deposition of a material comprising Ni, such as nickel nitride thereon. For example, a first $SiO_2$ surface can be treated to increase the amount of OH-groups on the surface.

In some embodiments $NiN_x$ deposition on the first surface, such as a first $SiO_2$ surface of the substrate, relative to the second H-terminated surface of the substrate is at least about 90% selective, at least about 95% selective, at least about 96%, 97%, 98% or 99% or greater selective. In some embodiments $NiN_x$ deposition only occurs on the first surface and does not occur on the second surface. In some embodiments $NiN_x$ deposition on the first surface of the substrate relative to the second surface of the substrate is at least about 50% selective, at least about 70% selective, or at least about 80% selective, which may be selective enough for some particular applications.

Figure 3:
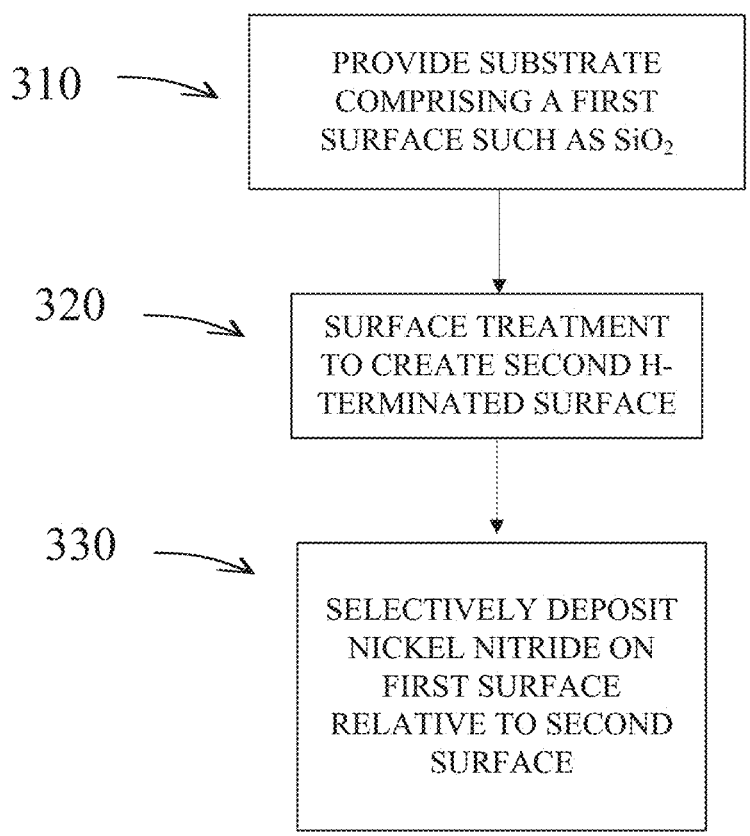
FIG. 3 illustrates a deposition process flow for selectively depositing nickel nitride ($NiN_x$) on a first surface of a substrate relative to a second, different surface of the same substrate.

Referring to FIG. 3 and according to some embodiments a substrate comprising a surface as described above, such as a $SiO_2$ surface is provided at step 310. A portion of the $SiO_2$ surface is selectively treated by exposure to HF to form a second surface comprising H-terminations, such as —$SiH_3$, —$SiH_2$, or —SiH 320.

A material comprising Ni, such as Nickel nitride ($NiN_x$) is selectively deposited 330 on the $SiO_2$ surface of the substrate relative to the H-terminated surface by a vapor deposition process, such as by ALD or CVD.

In some embodiments a material comprising Ni, such as a nickel nitride thin film is selectively formed on a first $SiO_2$ surface on a substrate in a reaction chamber relative to a second H-terminated surface, such as a $SiH_x$ terminated surface, by an ALD type process comprising multiple nickel nitride deposition cycles, each deposition cycle comprising:

contacting the substrate surface with a first vapor phase reactant comprising a first Ni precursor to form a layer of the Ni precursor on the substrate;

removing excess first reactant from the substrate surface;

contacting the substrate with a second vapor phase nitrogen reactant such that the second reactant reacts with the first Ni precursor on the substrate in a self-limiting manner to form a material comprising Ni, such as $NiN_x$; and removing excess second reactant and reaction byproducts, if any, from the substrate surface.

This can be referred to as the $NiN_x$ deposition cycle. Each $NiN_x$ deposition cycle typically forms at most about one monolayer of $NiN_x$ selectively on the $SiO_2$ surface. In some cases where the deposition temperature is above the decomposition temperature of the Ni precursor, more than one monolayer of $NiN_x$ can be formed in each $NiN_x$ deposition cycle. The $NiN_x$ deposition cycle is repeated until a film of a desired thickness is formed.

In some embodiments, the reactants and reaction byproducts can be removed from the substrate surface by stopping the flow of reactant while continuing the flow of an inert carrier gas such as nitrogen or argon. In some embodiments the reactants and reaction by-products can be removed from the substrate surface by removing the substrate from the reaction chamber, or moving the substrate within the reaction chamber.

As mentioned above, in some embodiments a $NiN_x$ layer is selectively deposited on a first surface as described above, such as a $SiO_2$ surface of a substrate relative to a second H-terminated surface by a CVD process, such as a pulsed CVD process, in which a Ni precursor and a nitrogen precursor are provided to the reaction chamber.

In some embodiments a single nickel precursor is utilized. Thus, in some embodiments the process may not include contacting the substrate with a vapor phase second reactant. In some embodiments a substrate is exposed to one precursor pulse, or sequential precursor pulses separate by a precursor removal or purge step. For example, in some embodiments a substrate may be continuously or intermittently contacted with a vapor phase nickel precursor and not with a vapor phase second reactant. Although in some embodiments a substrate may be contact by another species that does not react, such as an inert purge gas or carrier gas, in addition to the vapor phase nickel precursor. In some embodiments a deposition process may include only one nickel precursor pulse. In some embodiments the substrate may be contacted with a vapor phase nickel precursor, excess nickel precursor and reaction byproducts, if any, may be removed from the substrate surface, and the substrate may again be contacted with a vapor phase nickel precursor, for example in a sequential pulse. In some embodiments the substrate may not contacted with a second reactant. Although in some embodiments a substrate may be contacted by another species that does not react, such as an inert purge gas or carrier gas, in addition to the vapor phase nickel precursor.

Selective Deposition of Co on $SiO_2$

As mentioned above, in some embodiments a material comprising cobalt is selectively deposited on a first substrate surface (as described above, such as a $SiO_2$ surface of a substrate) relative to a second, H-terminated surface of the same substrate, such as an —$SiH_3$, —$SiH_2$, or —SiH surface.

In some embodiments the second, H-terminated surface is formed prior to deposition by treating a surface to provide H-terminations and thereby inhibit cobalt deposition on the second surface relative to the first surface. In some embodiments the treatment may be an in situ treatment. In some embodiments the second surface may be an $SiO_2$ surface that is treated to provide a H-terminated surface, for example an —$SiH_3$, —$SiH_2$, or —SiH terminated surface. In some embodiments the second surface may be contacted with a chemical that provides an H-termination, such as by forming a —$SiH_3$, —$SiH_2$, or —SiH surface. In some embodiments treatment of a $SiO_2$ surface may comprise etching that surface with HF, such as 0.5% HF. A mask or other processes may be used to treat one or more portions of the first surface to create the second H-terminated surface. For example, a mask or other process may be used to selectively etch one or more portions of a $SiO_2$ substrate in order to form a second $SiH_x$ surface while remaining portions of the first $SiO_2$ surface are not disturbed.

In some embodiments the first surface can be treated to enhance Co deposition thereon. For example, a first $SiO_2$ surface can be treated to increase the amount of OH-groups on the surface.

In some embodiments cobalt deposition on a first surface relative to a second surface, such as a first $SiO_2$ surface of the substrate relative to a second $SiH_x$ surface of the substrate, is at least about 90% selective, at least about 95% selective, at least about 96%, 97%, 98% or 99% or greater selective. In some embodiments deposition only occurs on the first surface and does not occur on the second surface. In some embodiments deposition on the first surface of the substrate relative to the second surface of the substrate is at least about 50% selective, at least about 70% selective, or at least about 80% selective, which may be selective enough for some particular applications.

Figure 4:
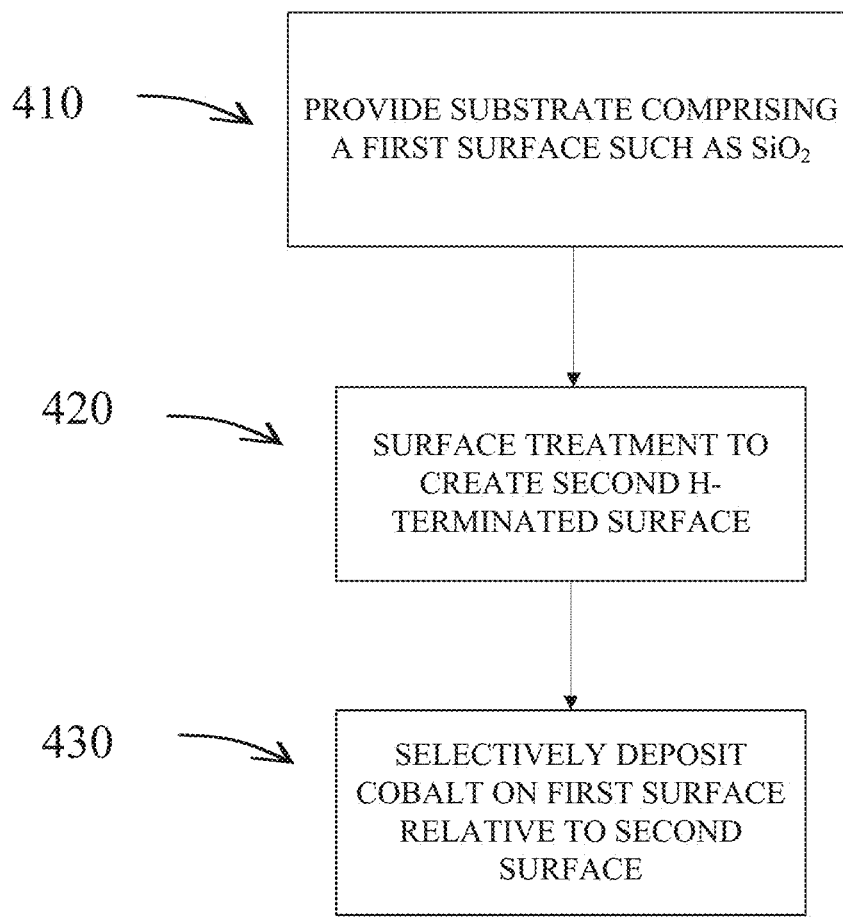
FIG. 4 illustrates a deposition process flow for selectively depositing cobalt on a first surface of a substrate relative to a second, different surface of the same substrate.

Referring to FIG. 4 and according to some embodiments a substrate comprising a first surface as described above, such as a $SiO_2$ surface is provided at step 410. A portion of the $SiO_2$ surface is selectively treated by exposure to HF to form a H-terminated second surface, such as a —$SiH_3$, —$SiH_2$, or —SiH surface 420.

Cobalt is selectively deposited 430 on the $SiO_2$ surface of the substrate relative to the H-terminated surface by a vapor deposition process, such as by ALD or CVD.

In some embodiments an elemental Co thin film is selectively formed on a first $SiO_2$ surface of a substrate in a reaction chamber relative to a second H-terminated surface, such as a —$SiH_3$, —$SiH_2$, or —SiH terminated surface, by an ALD type process comprising multiple Co deposition cycles, each deposition cycle comprising:
  contacting the substrate surface with a first vapor phase reactant comprising a first Co precursor to form a layer of the Co precursor on the substrate;
  removing excess first reactant from the substrate surface;
  contacting the substrate with a second vapor phase reactant such that the second reactant reacts with the first Co precursor on the substrate in a self-limiting manner to form Co; and
  removing excess second reactant and reaction byproducts, if any, from the substrate surface.

This can be referred to as the Co deposition cycle. Each Co deposition cycle typically forms at most about one monolayer of Co selectively on the $SiO_2$ surface. In some cases where the deposition temperature is above the decomposition temperature of the Co precursor, more than one monolayer of Co can be formed in each Co deposition cycle. The Co deposition cycle is repeated until a film of a desired thickness is formed.

Although the illustrated Co deposition cycle begins with provision of the first Co precursor, in other embodiments the deposition cycle begins with the provision of the second reactant. It will be understood by the skilled artisan that provision of the first Co precursor and second reactant are interchangeable in the ALD cycle.

In some embodiments, the reactants and reaction byproducts can be removed from the substrate surface by stopping the flow of reactant while continuing the flow of an inert carrier gas such as nitrogen or argon. In some embodiments the reactants and reaction by-products can be removed from the substrate surface by removing the substrate from the reaction chamber, or moving the substrate within the reaction chamber.

As mentioned above, in some embodiments a cobalt thin film is selectively deposited on a first surface, such as a $SiO_2$ surface relative to a H-terminated surface, such as —$SiH_3$, —$SiH_2$, or —SiH terminated surface, by a pulsed CVD process in which a vapor phase cobalt precursor is alternately pulsed into a reaction space comprising the substrate and purged from the reaction space.

In some embodiments a single cobalt precursor is utilized. Thus, in some embodiments the process may not include contacting the substrate with a vapor phase second reactant. In some embodiments a substrate is exposed to one precursor pulse, or sequential precursor pulses separate by a precursor removal or purge step. For example, in some embodiments a substrate may be continuously or intermittently contacted with a vapor phase cobalt precursor and not with a vapor phase second reactant. Although in some embodiments a substrate may be contacted by another species that does not react, such as an inert purge gas or carrier gas, in addition to the vapor phase cobalt precursor. In some embodiments a deposition process may include only one cobalt precursor pulse. In some embodiments the substrate may be contacted with a vapor phase cobalt precursor, excess cobalt precursor and reaction byproducts, if any, may be removed from the substrate surface, and the substrate may again be contacted with a vapor phase cobalt precursor, for example in a sequential pulse. In some embodiments the substrate may not contacted with a second reactant. Although in some embodiments a substrate may be contact by another species that does not react, such as an inert purge gas or carrier gas, in addition to the vapor phase cobalt precursor.

Selective Deposition of Fe on $SiO_2$

As mentioned above, in some embodiments a material comprising Fe is selectively deposited on a first substrate surface (as described above, such as a $SiO_2$ surface of a substrate) relative to a second, H-terminated surface of the same substrate, such as an —$SiH_3$, —$SiH_2$, or —SiH surface.

In some embodiments the second, H-terminated surface is formed prior to deposition by treating a surface to provide H-terminations and thereby inhibit iron deposition on the second surface relative to the first surface. In some embodiments the treatment may be an in situ treatment. In some embodiments the second surface may be an $SiO_2$ surface that is treated to provide a H-terminated surface, for example an —$SiH_3$, —$SiH_2$, or —SiH surface. In some embodiments the second surface may be contacted with a chemical that provides an H-termination, such as by forming a —$SiH_3$, —$SiH_2$, or —SiH surface. In some embodiments treatment of a $SiO_2$ surface may comprise etching that surface with HF, such as 0.5% HF. A mask or other processes may be used to treat one or more portions of the first surface to create the second H-terminated surface. For example, a mask or other process may be used to selectively etch one or more portions of a $SiO_2$ substrate in order to form a second $SiH_x$ surface while remaining portions of the first $SiO_2$ surface are not disturbed.

In some embodiments the first surface can be treated to enhance Fe deposition thereon. For example, a first $SiO_2$ surface can be treated to increase the amount of OH-groups on the surface.

In some embodiments nickel deposition on a first surface relative to a second surface, such as a first $SiO_2$ surface of the substrate relative to a second $SiH_x$ surface of the substrate, is at least about 90% selective, at least about 95% selective, at least about 96%, 97%, 98% or 99% or greater selective. In some embodiments deposition only occurs on the first surface and does not occur on the second surface. In some embodiments deposition on the first surface of the substrate relative to the second surface of the substrate is at least about 50% selective, at least about 70% selective, or at least about 80% selective, which may be selective enough for some particular applications.

Figure 5:
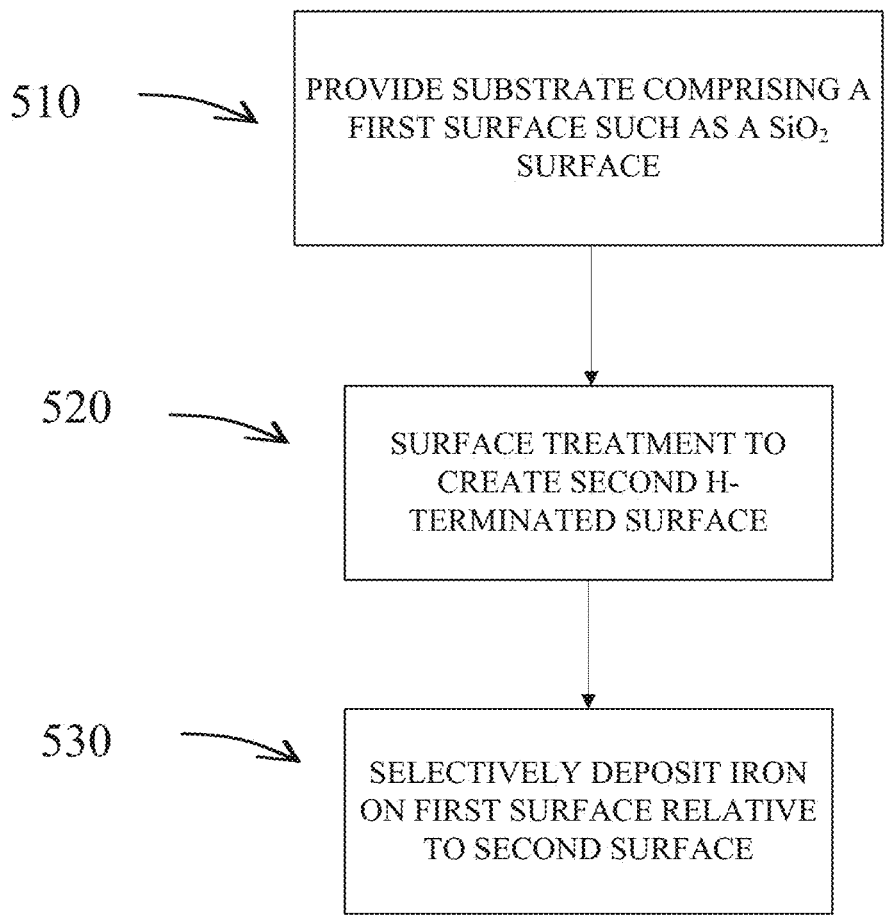
FIG. 5 illustrates a deposition process flow for selectively depositing iron on a first surface of a substrate relative to a second, different surface of the same substrate.

Referring to FIG. 5 and according to some embodiments a substrate comprising a first surface as described above, such as a $SiO_2$ surface is provided at step 510. A portion of the $SiO_2$ surface is selectively treated by exposure to HF to form a H-terminated second surface, such as a —$SiH_3$, —$SiH_2$, or —SiH surface 520.

Fe is selectively deposited 530 on the $SiO_2$ surface of the substrate relative to the H-terminated surface by a vapor deposition process, such as by ALD or CVD.

In some embodiments an elemental Fe thin film is selectively formed on a first $SiO_2$ surface of a substrate in a reaction chamber relative to a second H-terminated surface, such as a —SiH$_3$, —SiH$_2$, or —SiH surface, by an ALD type process comprising multiple Fe deposition cycles, each deposition cycle comprising:

contacting the substrate surface with a first vapor phase reactant comprising a first Fe precursor to form a layer of the Fe precursor on the substrate;

removing excess first reactant from the substrate surface;

contacting the substrate with a second vapor phase reactant such that the second reactant reacts with the first Fe precursor on the substrate in a self-limiting manner to form Fe; and removing excess second reactant and reaction byproducts, if any, from the substrate surface.

This can be referred to as the Fe deposition cycle. Each Fe deposition cycle typically forms at most about one monolayer of Fe selectively on the SiO$_2$ surface. In some cases where the deposition temperature is above the decomposition temperature of the Fe precursor, more than one monolayer of Fe can be formed in each Fe deposition cycle. The Fe deposition cycle is repeated until a film of a desired thickness is formed.

Although the illustrated Fe deposition cycle begins with provision of the first Fe precursor, in other embodiments the deposition cycle begins with the provision of the second reactant. It will be understood by the skilled artisan that provision of the first Fe precursor and second reactant are interchangeable in the ALD cycle.

In some embodiments, the reactants and reaction by-products can be removed from the substrate surface by stopping the flow of reactant while continuing the flow of an inert carrier gas such as nitrogen or argon. In some embodiments the reactants and reaction by-products can be removed from the substrate surface by removing the substrate from the reaction chamber, or moving the substrate within the reaction chamber.

As mentioned above, in some embodiments a Fe thin film is selectively deposited on a first surface, such as a SiO$_2$ surface relative to a H-terminated surface, such as —SiH$_3$, —SiH$_2$, or —SiH, by a pulsed CVD process in which a vapor phase Fe precursor is alternately pulsed into a reaction space comprising the substrate and purged from the reaction space.

In some embodiments a single Fe precursor is utilized. Thus, in some embodiments the process may not include contacting the substrate with a vapor phase second reactant. In some embodiments a substrate is exposed to one precursor pulse, or sequential precursor pulses separate by a precursor removal or purge step. For example, in some embodiments a substrate may be continuously or intermittently contacted with a vapor phase Fe precursor and not with a vapor phase second reactant. Although in some embodiments a substrate may be contact by another species that does not react, such as an inert purge gas or carrier gas, in addition to the vapor phase Fe precursor. In some embodiments a deposition process may include only one Fe precursor pulse. In some embodiments the substrate may be contacted with a vapor phase Fe precursor, excess Fe precursor and reaction byproducts, if any, may be removed from the substrate surface, and the substrate may again be contacted with a vapor phase Fe precursor, for example in a sequential pulse. In some embodiments the substrate may not contacted with a second reactant. Although in some embodiments a substrate may be contacted by another species that does not react, such as an inert purge gas or carrier gas, in addition to the vapor phase Fe precursor.

Selective Deposition of TiO$_2$ on SiO$_2$

As mentioned above, in some embodiments a material comprising Ti, such as TiO$_2$ is selectively deposited on a first substrate surface as described above, such as a first SiO$_2$ surface of a substrate relative to a second, H-terminated surface of the same substrate.

In some embodiments the second, H-terminated surface is formed prior to deposition by treating a surface to provide H-termination and thereby inhibit deposition of a material comprising Ti, such as titanium oxide deposition on the second surface relative to the first surface. In some embodiments the treatment may be an in situ treatment. In some embodiments the second surface may be an SiO$_2$ surface that is treated to provide a H-terminated surface, for example an —SiH$_3$, —SiH$_2$, or —SiH surface. In some embodiments the second surface may be contacted with a chemical that provides an H-termination, such as by forming a —SiH$_3$, —SiH$_2$, or —SiH surface. In some embodiments treatment of a SiO$_2$ surface may comprise etching that surface with HF, such as 0.5% HF. A mask or other processes may be used to treat one or more portions of the first surface to create the second H-terminated surface. For example, a mask or other process may be used to selectively etch one or more portions of a SiO$_2$ substrate in order to form a second —SiH$_3$, —SiH$_2$, or —SiH surface while remaining portions of the first SiO$_2$ surface are not disturbed.

In some embodiments the SiO$_2$ surface can be treated to increase the amount of OH-groups on the surface.

In some embodiments deposition of a material comprising Ti, such as TiO$_2$ on the first surface, such as a SiO$_2$ surface of the substrate relative to the second H-terminated surface, such as a —SiH$_3$, —SiH$_2$, or —SiH surface of the substrate is at least about 90% selective, at least about 95% selective, at least about 96%, 97%, 98% or 99% or greater selective. In some embodiments TiO$_2$ deposition only occurs on the first surface and does not occur on the second surface. In some embodiments TiO$_2$ deposition on the first surface of the substrate relative to the second surface of the substrate is at least about 50% selective, at least about 70% selective, or at least about 80% selective, which may be selective enough for some particular applications.

Figure 6:
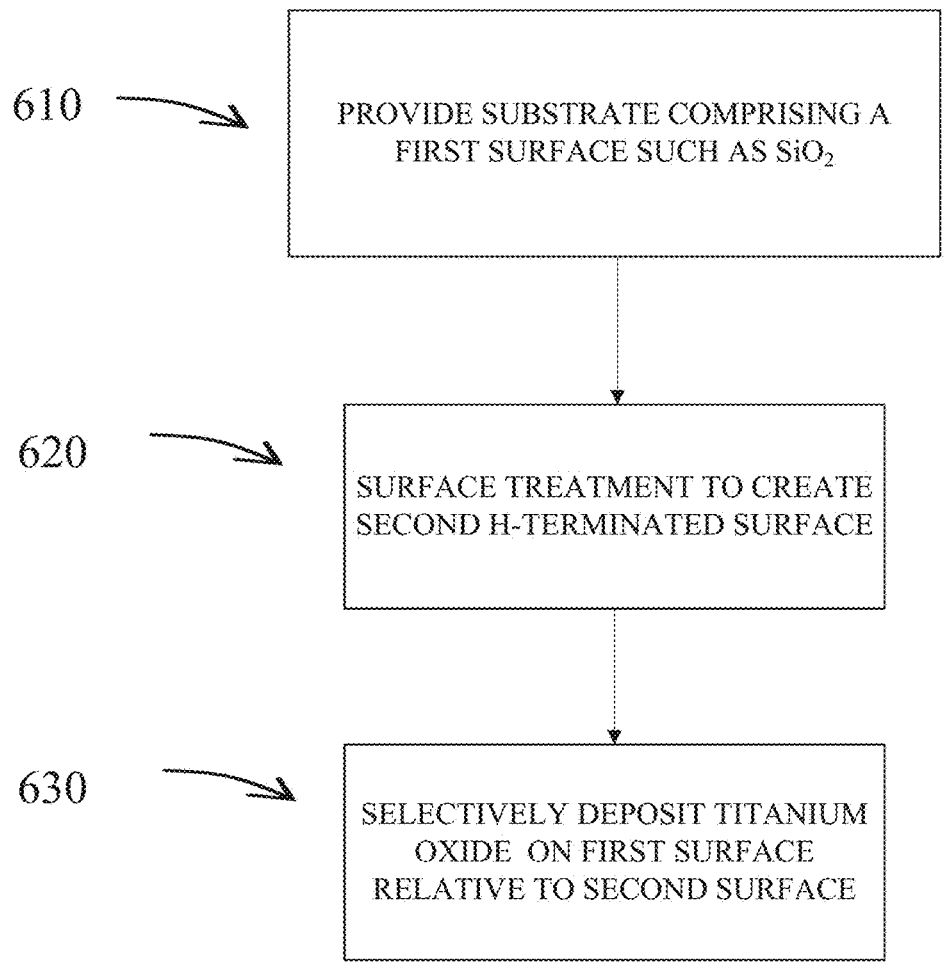
FIG. 6 illustrates a deposition process flow for selectively depositing titanium oxide on a first surface of a substrate relative to a second, different surface of the same substrate.

Referring to FIG. 6 and according to some embodiments a substrate comprising a SiO$_2$ surface is provided at step 610. A portion of the SiO$_2$ surface is selectively treated by exposure to HF to form a SiH$_x$ surface comprising H-terminations 420.

Titanium oxide is selectively deposited 430 on the SiO$_2$ surface of the substrate relative to the H-terminated surface by a vapor deposition process, such as by ALD or CVD.

In some embodiments a material comprising Ti, such as a titanium oxide thin film is selectively formed on a first SiO$_2$ surface on a substrate in a reaction chamber relative to a second H-terminated surface, such as a SiH$_x$ surface, by an ALD type process comprising multiple titanium oxide deposition cycles, each deposition cycle comprising:

contacting the substrate surface with a first vapor phase reactant comprising a first Ti precursor to form a layer of the Ti precursor on the substrate;

removing excess first reactant from the substrate surface;

contacting the substrate with a second vapor phase oxygen reactant such that the second reactant reacts with the first Ti precursor on the substrate in a self-limiting manner to form TiO$_2$; and removing excess second reactant and reaction byproducts, if any, from the substrate surface.

This can be referred to as the TiO$_2$ deposition cycle. Each TiO$_2$ deposition cycle typically forms at most about one monolayer of TiO$_2$ selectively on the SiO$_2$ surface. In some cases where the deposition temperature is above the decomposition temperature of the Ti precursor, more than one monolayer of $TiO_2$ can be formed in each $TiO_2$ deposition cycle. The $TiO_2$ deposition cycle is repeated until a film of a desired thickness is formed.

Although the illustrated $TiO_2$ deposition cycle begins with provision of the first Ti precursor, in other embodiments the deposition cycle begins with the provision of the second reactant. It will be understood by the skilled artisan that provision of the first Ti precursor and second reactant are interchangeable in the ALD cycle.

In some embodiments, the reactants and reaction by-products can be removed from the substrate surface by stopping the flow of reactant while continuing the flow of an inert carrier gas such as nitrogen or argon. In some embodiments the reactants and reaction by-products can be removed from the substrate surface by removing the substrate from the reaction chamber, or moving the substrate within the reaction chamber.

As mentioned above, in some embodiments a $TiO_2$ layer is selectively deposited on a first $SiO_2$ surface of a substrate relative to a second H-terminated surface by a CVD process, such as a pulsed CVD process, in which a Ti precursor and an oxygen precursor are provided to the reaction chamber. In some embodiments a single Ti precursor is utilized. Thus, in some embodiments the process may not include contacting the substrate with a vapor phase second reactant. In some embodiments a substrate is exposed to one precursor pulse, or sequential precursor pulses separate by a precursor removal or purge step. For example, in some embodiments a substrate may be continuously or intermittently contacted with a vapor phase Ti precursor and not with a vapor phase second reactant. Although in some embodiments a substrate may be contact by another species that does not react, such as an inert purge gas or carrier gas, in addition to the vapor phase Ti precursor. In some embodiments a deposition process may include only one Ti precursor pulse. In some embodiments the substrate may be contacted with a vapor phase Ti precursor, excess Fe precursor and reaction byproducts, if any, may be removed from the substrate surface, and the substrate may again be contacted with a vapor phase Ti precursor, for example in a sequential pulse. In some embodiments the substrate may not contacted with a second reactant. Although in some embodiments a substrate may be contacted by another species that does not react, such as an inert purge gas or carrier gas, in addition to the vapor phase Ti precursor.

Precursors

Suitable nickel precursors may be selected by the skilled artisan. In general, nickel compounds where the metal is bound or coordinated to oxygen, nitrogen, carbon or a combination thereof are preferred. In some embodiments a nickel precursor may be an organic compound. In some embodiments the nickel precursor is a metalorganic compound. In some embodiments the nickel precursor is a metal organic compound comprising bidentate ligands. In some embodiments the nickel precursor is bis(4-N-ethylamino-3-penten-2-N-ethyliminato)nickel (ii).

In some embodiments, nickel precursors can be selected from the group consisting of nickel betadiketonate compounds, nickel betadiketiminato compounds, nickel aminoalkoxide compounds, nickel amidinate compounds, nickel cyclopentadienyl compounds, nickel carbonyl compounds and combinations thereof. In some embodiments, $X(acac)_y$ or $X(thd)_y$ compounds are used, where X is a metal, y is generally, but not necessarily between 2 and 3 and thd is 2,2,6,6-tetramethyl-3,5-heptanedionato. Some examples of suitable betadiketiminato (e.g., $Ni(pda)_2$) compounds are mentioned in U.S. Pat. No. 9,103,019, the disclosure of which is incorporated herein in its entirety. Some examples of suitable amidinate compounds (e.g., $Ni(^iPr\text{-}AMD)_2$) are mentioned in U.S. Pat. No. 7,557,229, the disclosure of which is incorporated herein in its entirety.

The nickel precursor may also comprise one or more halide ligands. In preferred embodiments, the precursor is nickel betadiketiminato compound, such bis(4-N-ethylamino-3-penten-2-N-ethyliminato)nickel (II) [$Ni(EtN\text{-}EtN\text{-}pent)_2$], nickel ketoiminate, such bis(3Z)-4-nbutylamino-pent-3-en-2-one-nickel(II), nickel amidinate compound, such as methylcyclopentadienyl-isopropylacetamidinate-nickel (II), nickel betadiketonato compound, such as $Ni(acac)_2$, $Ni(thd)_2$ or nickel cyclopentadienyl compounds, such $Ni(cp)_2$, $Ni(Mecp)_2$, $Ni(Etcp)_2$ or derivatives thereof, such as methylcyclopentadienyl-isopropylacetamidinate-nickel (II). In more preferred embodiment, the precursor is bis(4-N-ethylamino-3-penten-2-N-ethyliminato)nickel (II).

In some embodiments the first Ni precursor is bis(4-N-ethylamino-3-penten-2-N-ethyliminato)nickel (II).

Titanium precursors can be selected by the skilled artisan and can be, for example, titanium alkoxides (methoxide, ethoxide, isopropoxide), and titanium alkylalmines.

Fe precursors can be selected by the skilled artisan. In some embodiments the Fe precursor is $Cp_2Fe$ or a derivative thereof. In some embodiments the Fe precursor is $Fe(acac)_2$. In some embodiments the Fe precursor is Fe-alkoxide, such as iron(III) tert-butoxide ($Fe_2(O^tBu)_6$). In some embodiments the Fe precursor is $Fe(CO)_5$. In some embodiments the Fe precursor contains at least one cyclopentadienyl ligand (Cp), substituted cyclopentadienyl ligand or derivative thereof. In some embodiments the Fe precursor contains at least one carbonyl ligand (—CO) or derivative thereof. In some embodiments the Fe precursor contains at least one carbonyl ligand (—CO) and at least one organic ligand such as cyclopentadienyl ligand (Cp) or substituted cyclopentadienyl ligand or derivative thereof.

Co precursors can be selected by the skilled artisan. In some embodiments the cobalt precursor may comprise a cobalt betadiketiminato compound, cobalt ketoiminate compound, cobalt amidinate compound or cobalt betadiketonate compound.

In some embodiments the second precursor, or second reactant in an ALD process for forming elemental nickel is selected from hydrogen and forming gas. In other embodiments the second reactant may be an alcohol, such as EtOH.

In some embodiments the second reactant is an organic reducing agent. The organic reducing agents preferably have at least one functional group selected from the group consisting of alcohol (—OH), as mentioned above, or aldehyde (—CHO), or carboxylic acid (—COOH).

Reducing agents containing at least one alcohol group may be selected from the group consisting of primary alcohols, secondary alcohols, tertiary alcohols, polyhydroxy alcohols, cyclic alcohols, aromatic alcohols, halogenated alcohols, and other derivatives of alcohols.

Preferred primary alcohols have an —OH group attached to a carbon atom which is bonded to another carbon atom, in particular primary alcohols according to the general formula (I):

$$R^1\text{—OH} \qquad (I)$$

wherein $R^1$ is a linear or branched $C_1\text{-}C_{20}$ alkyl or alkenyl groups, preferably methyl, ethyl, propyl, butyl, pentyl or hexyl. Examples of preferred primary alcohols include methanol, ethanol, propanol, butanol, 2-methyl propanol and 2-methyl butanol.

Preferred secondary alcohols have an —OH group attached to a carbon atom that is bonded to two other carbon atoms. In particular, preferred secondary alcohols have the general formula (II):

$$R^1-\underset{\underset{\displaystyle }{|}}{\overset{\overset{\displaystyle OH}{|}}{CH}}-R^1 \qquad (II)$$

wherein each $R^1$ is selected independently from the group of linear or branched $C_1$-$C_{20}$ alkyl and alkenyl groups, preferably methyl, ethyl, propyl, butyl, pentyl or hexyl. Examples of preferred secondary alcohols include 2-propanol and 2-butanol.

Preferred tertiary alcohols have an —OH group attached to a carbon atom that is bonded to three other carbon atoms. In particular, preferred tertiary alcohols have the general formula (III):

$$R^1-\underset{\underset{\displaystyle R^1}{|}}{\overset{\overset{\displaystyle OH}{|}}{C}}-R^1 \qquad (III)$$

wherein each $R^1$ is selected independently from the group of linear or branched $C_1$-$C_{20}$ alkyl and alkenyl groups, preferably methyl, ethyl, propyl, butyl, pentyl or hexyl. An example of a preferred tertiary alcohol is tert-butanol.

Preferred polyhydroxy alcohols, such as diols and triols, have primary, secondary and/or tertiary alcohol groups as described above. Examples of preferred polyhydroxy alcohol are ethylene glycol and glycerol.

Preferred cyclic alcohols have an —OH group attached to at least one carbon atom which is part of a ring of 1 to 10, more preferably 5-6 carbon atoms.

Preferred aromatic alcohols have at least one —OH group attached either to a benzene ring or to a carbon atom in a side chain. Examples of preferred aromatic alcohols include benzyl alcohol, o-, p- and m-cresol and resorcinol.

Preferred halogenated alcohols have the general formula (IV):

$$CH_nX_{3-n}-R^2-OH \qquad (IV)$$

wherein X is selected from the group consisting of F, Cl, Br and I, n is an integer from 0 to 2 and $R^2$ is selected from the group of linear or branched $C_1$-$C_{20}$ alkyl and alkenyl groups, preferably methyl, ethyl, propyl, butyl, pentyl or hexyl. More preferably X is selected from the group consisting of F and Cl and $R^2$ is selected from the group consisting of methyl and ethyl. An example of a preferred halogenated alcohol is 2,2,2-trifluoroethanol.

Other derivatives of alcohols that may be used include amines, such as methyl ethanolamine.

Preferred reducing agents containing at least one aldehyde group (—CHO) are selected from the group consisting of compounds having the general formula (V), alkanedial compounds having the general formula (VI), halogenated aldehydes and other derivatives of aldehydes.

Thus, in some embodiments reducing agents are aldehydes having the general formula (V):

$$R^3-CHO \qquad (V)$$

wherein $R^3$ is selected from the group consisting of hydrogen and linear or branched $C_1$-$C_{20}$ alkyl and alkenyl groups, preferably methyl, ethyl, propyl, butyl, pentyl or hexyl. More preferably, $R^3$ is selected from the group consisting of methyl or ethyl. Examples of preferred compounds according to formula (V) are formaldehyde, acetaldehyde and butyraldehyde.

In other embodiments reducing agents are aldehydes having the general formula (VI):

$$OHC-R^4-CHO \qquad (VI)$$

wherein $R^4$ is a linear or branched $C_1$-$C_{20}$ saturated or unsaturated hydrocarbon. Alternatively, the aldehyde groups may be directly bonded to each other ($R^4$ is null).

Reducing agents containing at least one —COOH group may be selected from the group consisting of compounds of the general formula (VII), polycarboxylic acids, halogenated carboxylic acids and other derivatives of carboxylic acids.

Thus, in some embodiment preferred reducing agents are carboxylic acids having the general formula (VII):

$$R^5-COOH \qquad (VII)$$

wherein $R^5$ is hydrogen or linear or branched $C_1$-$C_{20}$ alkyl or alkenyl group, preferably methyl, ethyl, propyl, butyl, pentyl or hexyl, more preferably methyl or ethyl. Examples of preferred compounds according to formula (VII) are formic acid and acetic acid, most preferably formic acid (HCOOH).

In some embodiments a third reactant is used in the ALD cycle. In some embodiments, an ALD-type process for depositing Ni thin films comprises alternate and sequential pulses of a nickel reactant, an organic reducing agent, and hydrogen or forming gas (such as 5% or 10% $H_2$ in $N_2$).

In embodiments in which titanium oxide is formed, exemplary oxygen reactants that may be used include, but are not limited to water, ozone, oxygen plasma, oxygen radicals or oxygen atoms.

In embodiments in which nickel nitride is formed, exemplary nitrogen reactants that may be used include $NH_3$. N-containing plasma, N/H-containing plasma.

EXAMPLES

Figure 7:
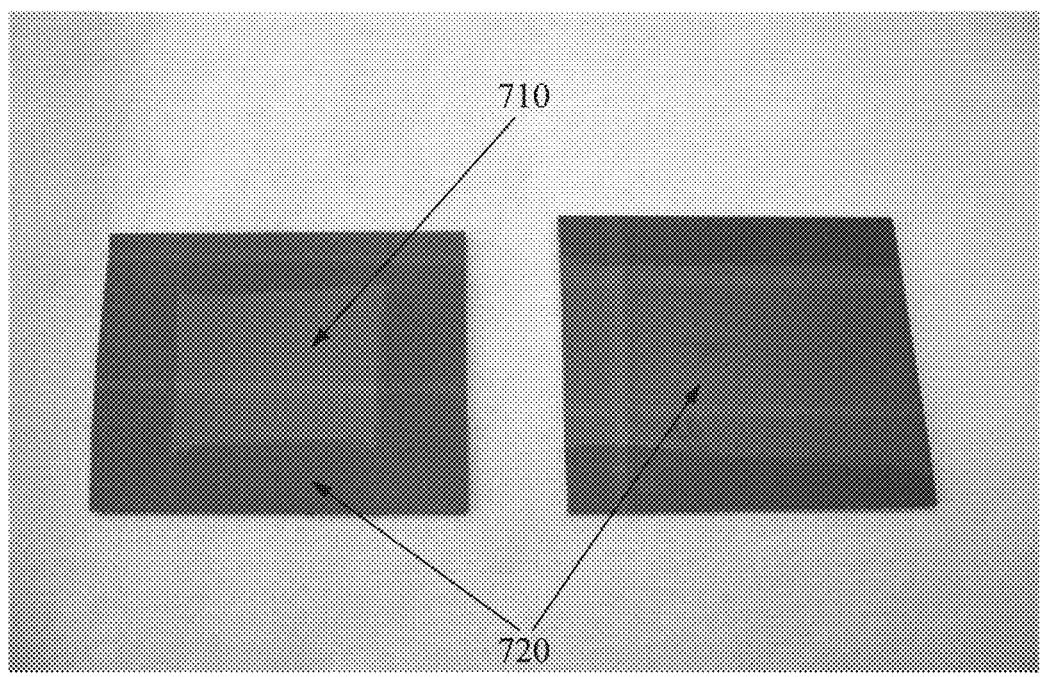
FIG. 7 depicts an nickel film that was selectively deposited on a first surface of a first substrate relative to a second, different surface of the first substrate and a second substrate according to an exemplary process as described herein.

The growth of Ni and $Ni_xN_y$ was studied in both F-120 and Pulsar® 2000 reactors. Two coupon substrates (5×5 cm2) were loaded in an F-120 reactor simultaneously. The test was performed with a first substrate comprising a first $SiO_2$ surface and a second HF etched Si surface, and a second substrate comprising an HF etched Si surface in the same deposition run. The first substrate comprising a $SiO_2$ surface was masked and etched with HF to form a first $SiO_2$ surface 710 and a second H-terminated surface 720. The reaction temperature was set to 300° C. and Ni was grown by a pulsed CVD process as described herein, using bis(4-N-ethylamino-3-penten-2-N-ehtyliminato nickel (II) as a Ni precursor. The CVD process included 1500 pulse and purge steps. No second reactant was pulsed into the reaction chamber. As illustrated in FIG. 7, nickel was selectively deposited on the first $SiO_2$ surface 710 of the first substrate relative to the second HF etched (Si—H) surface 720. No nickel was deposited on the second substrate comprising an HF etched Si surface. Thus, the deposition temperature was high enough to obtain Ni precursor decomposition on an Si—OH terminated surface, for example surface 710, but not on Si—H terminated surface such as surface 720.

A test was also performed in a Pulsar® 2000 reactor, and deposition was carried out according to a process as described herein by pulsing a nickel precursor and a $NH_3$ second reactant 4000 times at a temperature of 300° C. No film was observed on the HF etched 200 mm Si wafer, while a $Ni_xN_y$ film was deposited on a first surface comprising $SiO_2$ of a 200 mm wafer relative to a second surface comprising Si.

Another test was also performed in a Pulsar® 2000 reactor, and deposition was carried out using bis(4-N-ethylamino-3-penten-2-N-ehtyliminato)nickel (II) as a Ni precursor. The CVD process included 5000 pulses, with a duration of about is each, and purges, with a duration of about 5 s each, at reaction temperature of 300° C. Nickel was selectively deposited on the first $SiO_2$ surface of the first substrate relative to the second HF etched (Si—H) surface of the second substrate. XPS analysis confirmed the deposition of nickel on the $SiO_2$ surface. No nickel was deposited on the second substrate comprising an HF etched Si surface. Thus, the deposition temperature was high enough to obtain Ni precursor decomposition on, for example, an Si—OH terminated surface, but not on, for example, a Si—H terminated surface.

Selective Growth of $SiO_2$ on Si—H Relative to $SiO_2$

The selective deposition of a material comprising Ni, Ti, Fe, or Co, such as nickel, nickel nitride or titanium oxide on a $SiO_2$ surface relative to an H-terminated surface, such as an $SiH_3$, $—SiH_2$, or SiH surface, allows for the selective growth of $SiO_2$ on the H-terminated surface. In some embodiments following selective deposition of a material comprising Ni, Ti, Fe, or Co on a first surface as described herein, such as a $SiO_2$ surface, relative to a second H-terminated surface, as described herein, $SiO_2$ can subsequently be selectively deposited on the second H-terminated surface (such as a $SiH_3$, $—SiH_2$, or SiH surface) relative to the first surface, for example a Ni, $NiN_x$, Fe or Co or titanium oxide surface. Deposition of the $SiO_2$ may be by any method known in the art, such as by PEALD using oxygen radicals, plasma or atomic oxygen, or by thermal ALD using, for example ozone. In some embodiments both thermal and plasma ALD processes are employed. Silicon precursors that are known in the art may be used. In some embodiments a silicon precursor may comprise $(R^{I}R^{II}N)_2SiH_2$, $X_ySiH_{4-y}$, $(R^{I}R^{II}N)_ySiH_{4-y}$, or $(R^{I}R^{II}N)SiH_3$, where $R^{I}$ and $R^{II}$ are preferably independently selected from $C_1$-$C_5$ alkyls, such as methyl, ethyl, n-propyl, i-propyl, n-butyl, i-butyl, and X can be, for example, a halide. In some embodiments the $SiO_2$ is formed by exposing the substrate to oxygen plasma.

Following selective growth of the $SiO_2$ of a desired thickness on the second surface relative to the first surface, the a material comprising Ni, Ti, Fe, or Co that was previously deposited on the first surface can be removed, such as by etching. The etch process preferably leaves the newly formed $SiO_2$ layer on the second surface intact. By blocking the first $SiO_2$ surface with a material comprising Ni, Ti, Fe, or Co, selective formation of $SiO_2$ on the H-terminated surface (such as a SiH, $—SiH_2$, or $SiH_3$ surface) relative to the blocked $SiO_2$ surface is possible.

In some embodiments the etch step comprises exposing the substrate to a selective metal etch (e.g., HCl, or piranha ($H_2SO_4$:$H_2O_2$) dip). For example, the substrate may be dipped in dilute aqueous HCl and/or $HNO_3$ or piranha etch, which can etch most metals, including nickel, without appreciable attack of silicon, silicon oxide or other nonmetal materials used in integrated circuit manufacture.

We claim:

1. A deposition method comprising:
providing a substrate comprising a first surface and a second, chemically different surface, wherein the first surface comprises at least one $AH_x$ termination, where A is one or more of N, O, or S and x is from 1 to 2, and the second surface comprises Si—$H_x$ terminations surface, where x is from 1 to 3; and
contacting the first surface and the second surface of the substrate with a first vapor phase precursor comprising Ni, Ti, Fe, or Co;
thereby selectively depositing a material comprising Ni, Ti, Fe, or Co on the first surface of the substrate relative to the second surface of the same substrate.

2. The method of claim 1, wherein the selectively deposited material comprises Ni or Co.

3. The method of claim 1, wherein selectively depositing further comprises contacting the substrate with a second vapor phase reactant.

4. The method of claim 1, wherein the second surface comprising Si—$H_x$ terminations is formed by treating at least a portion of the substrate surface prior to depositing the material.

5. The method of claim 1, wherein the second surface comprising Si—$H_x$ terminations is formed by treating at least a portion of the substrate surface with a HF etch.

6. The method of claim 1, wherein the second surface comprising Si—$H_x$ terminations is formed by treating at least a portion of the substrate surface with a silicon compound comprising $ClSiH_3$ or $(R^{I}R^{II}N)SiH_3$, where $R^{I}$ and $R^{II}$ are independently selected from $C_1$-$C_4$ alkyls, such as methyl, ethyl, n-propyl, i-propyl, n-butyl, i-butyl.

7. The method of claim 1, wherein the first surface comprises at least one OH-termination.

8. The method of claim 1, wherein the first surface comprises $SiO_2$.

9. The method of claim 1, wherein the first surface is a low-k insulator.

10. The method of claim 1, wherein the first surface comprises silicon oxide, silicon nitride, silicon oxynitride, fluorinated silica glass, carbon doped silicon oxide, or another material comprising at least 50% silicon oxide.

11. The method of claim 1, wherein the material comprising Ni, Ti, Fe, or Co is selectively deposited on the first surface relative to the second surface comprising Si—$H_x$ terminations with a selectivity of at least 90%.

12. The method of claim 1, further comprising etching the substrate to remove any material comprising Ni, Ti, Fe, or Co from the second H-terminated silicon surface of the substrate.

13. The method of claim 1, wherein the deposition method is an ALD or CVD process.

14. The method of claim 13, wherein the selective deposition process is an ALD process.

15. A method of selectively depositing a material comprising Ni, Ti, Fe, or Co on a substrate, the method comprising:
providing a substrate comprising a first surface comprising silicon oxide;
etching at least a portion of the first surface to thereby provide a second H-terminated silicon surface; and
selectively depositing a material comprising Ni, Ti, Fe, or Co on the first surface comprising silicon oxide relative to the second H-terminated silicon surface.

16. The method of claim 15, wherein the method of selectively depositing a material comprising Ni, TI, Fe, or Co on a substrate is an ALD or CVD process.

17. The method of claim 15, wherein etching at least a portion of the first surface comprises exposing said portion of the first surface to HF.

18. The method of claim 15, wherein the material comprising Ni, Ti, Fe, or Co film is selectively deposited on the first surface relative to the second H-terminated silicon surface with a selectivity of at least 90%.

19. A method for selectively forming $SiO_2$ on a substrate comprising:
- selectively depositing material comprising Ni, Ti, Fe, or Co on a first surface of the substrate relative to a second H-terminated silicon surface of the same substrate, wherein the first surface comprises at least an $AH_x$ termination, where A is one or more of O, N and S and x is from 1 to 2;
- selectively depositing $SiO_2$ on the second H-terminated silicon surface of the substrate relative to the first surface of the same substrate.

20. The method of claim 19, wherein the first surface comprises an OH-terminated surface.

21. The method of claim 19, wherein the first surface comprises silicon oxide.

22. The method of claim 19, wherein the second H-terminated silicon surface comprises —SiH, —$SiH_2$, or —$SiH_3$ surface terminations.

23. The method of claim 19, wherein $SiO_2$ is selectively deposited on the second H-terminated silicon surface of the substrate relative to the first surface by a PEALD or thermal ALD process.

24. The method of claim 19, wherein the method further comprises etching the substrate to remove the material comprising Ni, Ti, Fe, or Co from the substrate.

25. The method of claim 24, wherein etching the substrate comprises exposing the substrate to at least one of HCl, $HNO_3$, or $H_2SO_4$:$H_2O_2$.

* * * * *